United States Patent
Galiazzo et al.

(10) Patent No.: US 11,637,212 B2
(45) Date of Patent: Apr. 25, 2023

(54) APPARATUS AND METHOD FOR MANUFACTURING A SOLAR CELL ARRANGEMENT, AND SOLAR CELL ARRANGEMENT

(71) Applicant: APPLIED MATERIALS ITALIA S.R.L., San Biagio di Callalta (IT)

(72) Inventors: Marco Galiazzo, Quinto di Treviso (IT); Luigi De Santi, Spresiano (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 136 days.

(21) Appl. No.: 16/979,097

(22) PCT Filed: Mar. 8, 2018

(86) PCT No.: PCT/EP2018/055797
§ 371 (c)(1),
(2) Date: Sep. 8, 2020

(87) PCT Pub. No.: WO2019/170242
PCT Pub. Date: Sep. 12, 2019

(65) Prior Publication Data
US 2021/0367090 A1    Nov. 25, 2021

(51) Int. Cl.
*H01L 31/05* (2014.01)
*H01L 31/18* (2006.01)

(52) U.S. Cl.
CPC .......... *H01L 31/0504* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 2007/0089780 A1* | 4/2007 | Geyer | H01L 31/0504 257/E31.038 |
| 2009/0077805 A1* | 3/2009 | Bachrach | B23K 26/364 29/729 |
| 2015/0003041 A1 | 1/2015 | Reichenbach et al. | |
| 2015/0349145 A1* | 12/2015 | Morad | H01L 31/186 438/67 |
| 2016/0163914 A1* | 6/2016 | Gonzalez | H01L 31/188 156/60 |
| 2017/0125619 A1* | 5/2017 | Nakano | H01L 31/0504 |

FOREIGN PATENT DOCUMENTS

WO    2016/090341 A1    6/2016
WO    2017/190800 A1    11/2017

OTHER PUBLICATIONS

International Search Report and Written Opinion, PCT/EP2018/055797, dated Feb. 28, 2019.

* cited by examiner

*Primary Examiner* — Andrew J Golden
(74) *Attorney, Agent, or Firm* — Patterson + Sheridan, LLP

(57) ABSTRACT

An apparatus includes a first processing line. The first processing line includes a cleaving station adapted for separating a solar cell into two or more solar cell pieces. The apparatus includes a second processing line. The second processing line includes a storing station adapted for storing a plurality of solar cell pieces. The second processing line includes a transportation system adapted for transporting a solar cell piece from the storing station to the first processing line.

17 Claims, 10 Drawing Sheets

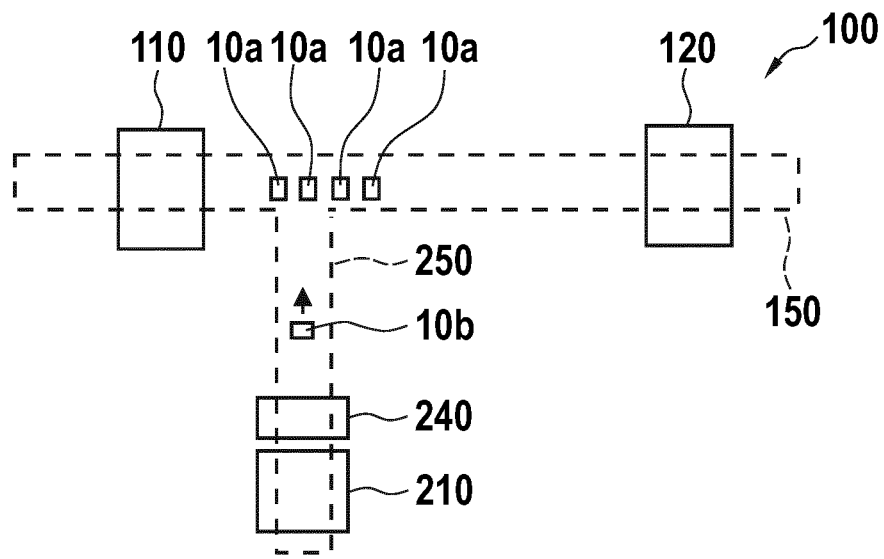
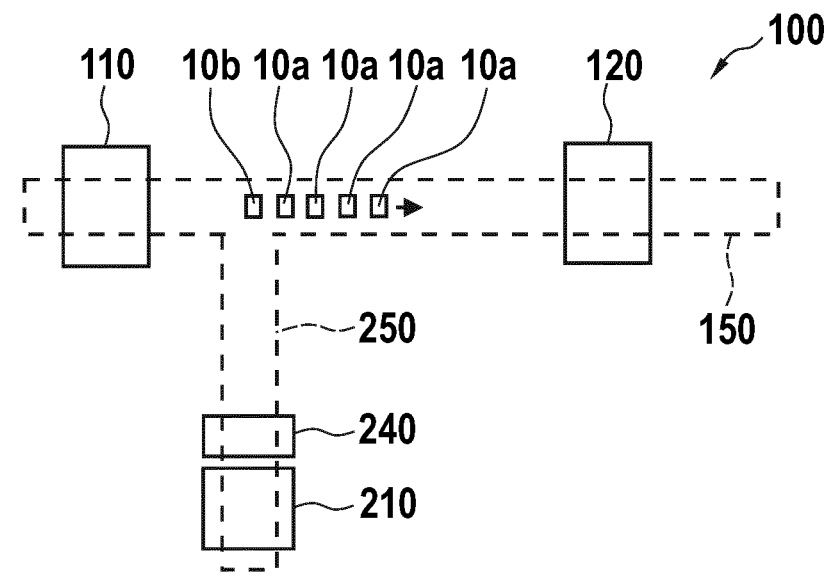
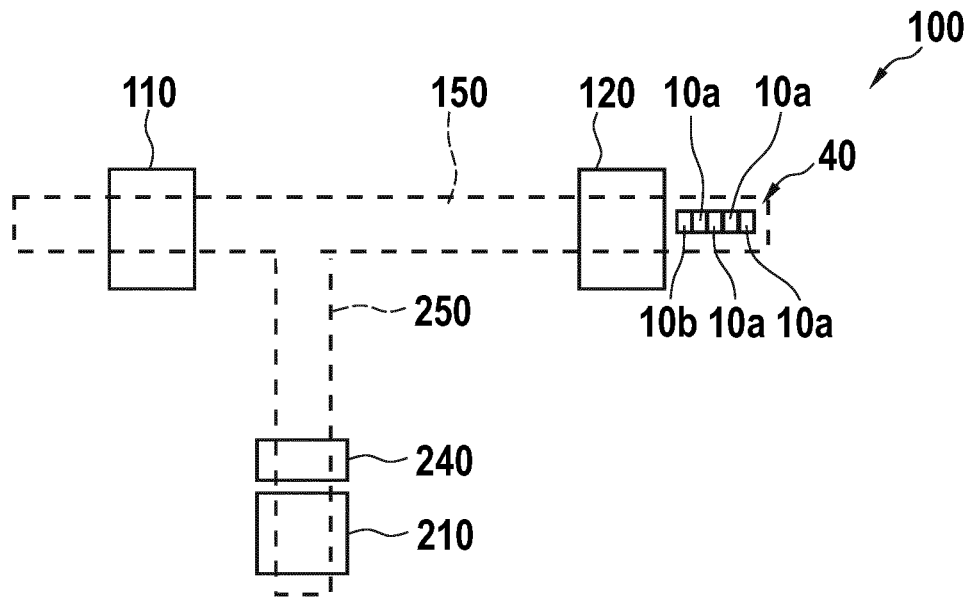

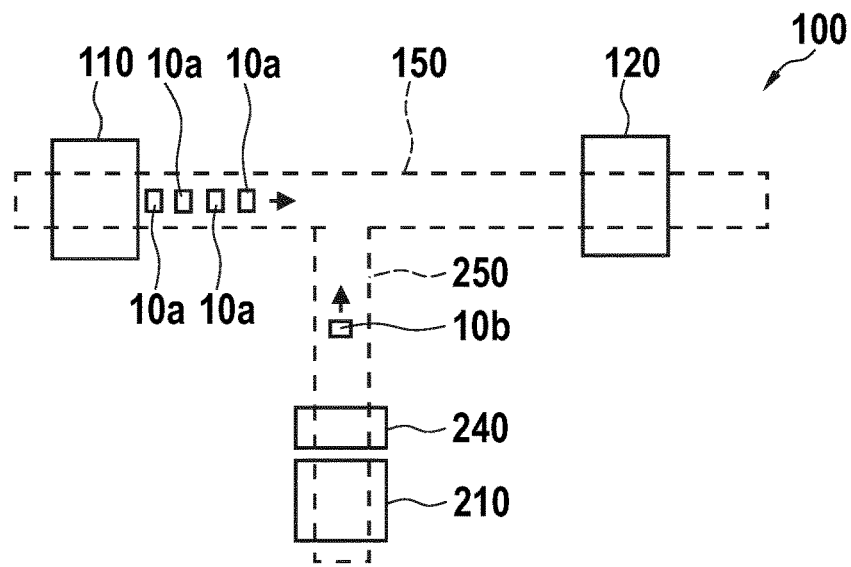
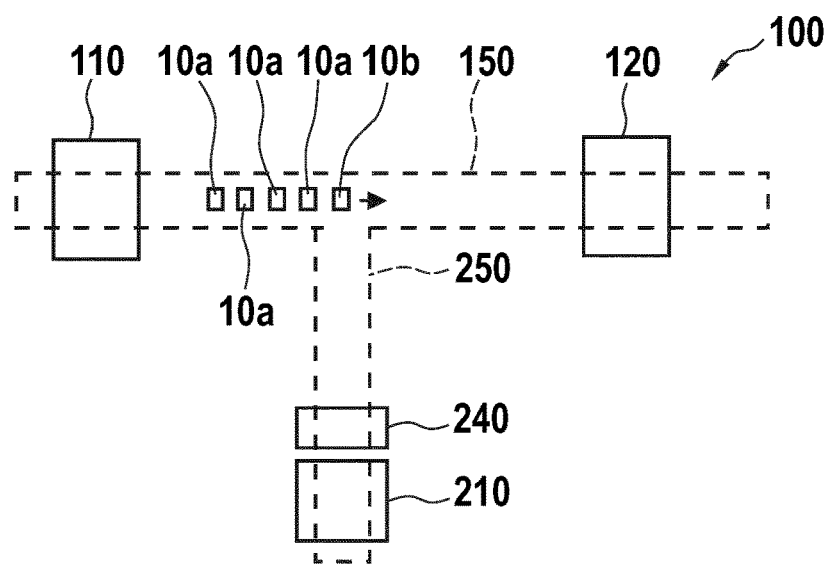
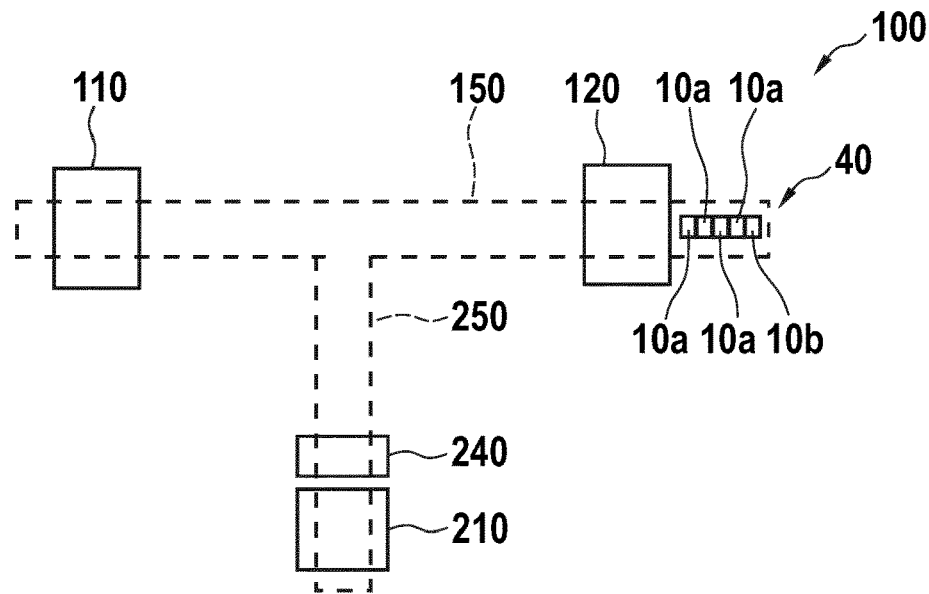

APPARATUS AND METHOD FOR MANUFACTURING A SOLAR CELL ARRANGEMENT, AND SOLAR CELL ARRANGEMENT

FIELD

Embodiments of the present disclosure relate to an apparatus and a method for manufacturing a solar cell arrangement, and to a solar cell arrangement. More specifically, embodiments described herein relate to an apparatus and a method for manufacturing a shingled solar cell arrangement including a string of overlapping solar cell pieces.

BACKGROUND

Solar cells are photovoltaic devices that convert sunlight directly into electrical power. The efficiency of the solar cells can be affected by an active area on a front surface of the solar cell which is exposed to light for converting sunlight into electrical power. The active area can be reduced due to the presence of electrical contacts, such as fingers and/or bus bars, on the front surface of the solar cells. The presence of the electrical contacts on the front surface of the solar cells can thus reduce a module power of a solar cell module including the solar cells.

Shingled solar cell arrangements can increase an output power of a solar cell module. The increase in the output power can be affected by a quality of a manufacturing process, such as a quality of the elements used to assemble the shingled solar cell arrangement. Further, a proper assembling of the shingled solar cell arrangement can be cumbersome, and a throughput and/or yield can be low.

In view of the above, new methods and apparatuses for processing solar cells for the manufacture of shingled solar cell arrangements that overcome at least some of the problems in the art are beneficial. The present disclosure particularly aims at improving the manufacturing process of solar cell arrangements, such as shingled solar cells.

SUMMARY

According to an embodiment, an apparatus is provided. The apparatus includes a first processing line. The first processing line includes a cleaving station adapted for separating a solar cell into two or more solar cell pieces. The apparatus includes a second processing line. The second processing line includes a storing station adapted for storing a plurality of solar cell pieces. The second processing line includes a transportation system adapted for transporting a solar cell piece from the storing station to the first processing line.

According to a further embodiment, an apparatus is provided. The apparatus includes a cleaving station adapted for separating a solar cell into two or more solar cell pieces. The apparatus includes an assembling station adapted for assembling a solar cell arrangement comprising a plurality of overlapping solar cell pieces. The apparatus includes a first transportation system adapted for transporting solar cell pieces from the cleaving station to the assembling station. The apparatus includes a storing station adapted for storing a plurality of solar cell pieces. The apparatus includes a second transportation system adapted for transporting solar cell pieces from the storing station to the first transportation system.

According to a further embodiment, a method for manufacturing a solar cell arrangement is provided. The method includes separating a solar cell into two or more solar cell pieces, the two or more solar cell pieces including a first solar cell piece. The method includes transporting the first solar cell piece to an assembling station. The method includes storing a second solar cell piece in a storing station. The method includes transporting the second solar cell piece from the storing station to the assembling station.

The method includes assembling a solar cell arrangement comprising a plurality of overlapping solar cell pieces. The solar cell arrangement includes the first solar cell piece and the second solar cell piece.

According to a further embodiment, a solar cell arrangement comprising a plurality of overlapping solar cell pieces is provided. The plurality of overlapping solar cell pieces includes a first solar cell piece and a second solar cell piece. The first solar cell piece includes a first bus bar on a front side of the first solar cell piece. The first bus bar has a first width. The second solar cell piece includes a second bus bar on a front side of the second solar cell piece. The second bus bar has a second width. The second width is larger than the first width.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 3-5 illustrate a method for manufacturing a solar cell arrangement according to embodiments described herein;

FIGS. 6-8 illustrate a method for manufacturing a solar cell arrangement according to embodiments described herein;

DETAILED DESCRIPTION OF EMBODIMENTS

Figure 1:
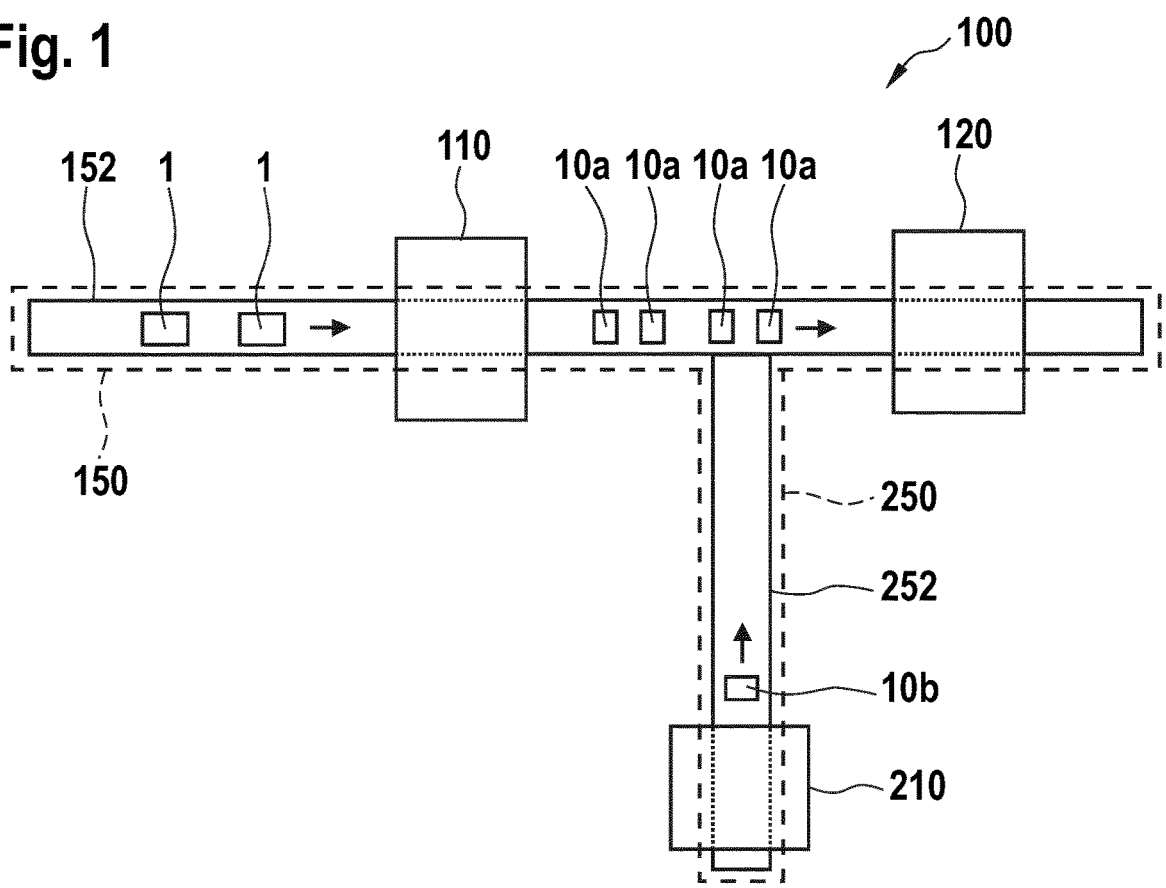
FIG. 1 illustrates an apparatus according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Some embodiments described herein involve the notion of a substantially vertical direction, plane, orientation and the like. A substantially vertical direction may deviate from exact verticality (the latter being defined by the gravitational force) by an angle of, e.g., up to 10 or even 15 degrees. Some embodiments described herein may involve the notion of a substantially horizontal direction, plane, orientation, and the like. A substantially horizontal direction may be substantially perpendicular to the exact vertical direction defined by gravity. The terminology of substantially perpendicular directions may include directions which form an angle of less than 90 degrees with each other, e.g. at least 80 degrees or at least 75 degrees.

A solar cell or solar cell piece may have a sunny side, or front side. The terms "sunny side" and "front side" are used interchangeably herein. A solar cell or solar cell piece may have a back side. The front side is opposite to the back side. The front side of a solar cell or solar cell piece is configured for receiving electromagnetic radiation, particularly sunlight. The solar cell or solar cell piece is configured for converting the electromagnetic radiation received by the front side into electrical power. The front side of a solar cell or solar cell piece may be the side of the solar cell or solar cell piece on which a conductive pattern comprising a plurality of fingers is provided. The back side of a solar cell or solar cell piece may not be configured to be exposed to sunlight for converting the sunlight into electrical power.

A configuration wherein the front side, or sunny side, of a solar cell or solar cell piece faces upward is referred to herein as a sunny-up configuration. A configuration wherein the front side of a solar cell or solar cell piece faces downward is referred to herein as a sunny-down configuration.

Embodiments described herein relate to shingled solar cell arrangements. A shingled solar cell arrangement can be made of a plurality of overlapping solar cell pieces. Adjacent solar cell pieces are electrically connected to each other in the overlapping region, e.g. via adhesives as described herein. The solar cell pieces are connected in series such that current generated by the individual solar cell pieces flows along the series of solar cell pieces to be collected, for example, at an end portion of the solar cell arrangement. The overlapping configuration can provide high-efficiency solar cell arrangements. In particular, the solar cell arrangements allow for increasing a solar cell module power by increasing a used or active area. Typically, the overlapping configuration can increase the module power by, for example, 20 to 40 Watts. The used or active area can correspond to an area that is irradiated by solar light and that participates in the generation of power. For example, the used or active area can correspond to an area of the solar cells that is not covered by, for example, conductive line patterns, such as fingers and/or bus bars.

An adhesive, as described herein, is configured for connecting, particularly attaching, solar cell pieces to each other. An adhesive can be an electrically conductive adhesive (ECA). An adhesive can be selected from the group consisting of solder, silver paste, silicone-based electrically conductive adhesive, and epoxy-based electrically conductive adhesive. An adhesive can be printed on a solar cell or solar cell piece. During printing, the adhesive can be in a substantially liquid form. Alternative to printing the adhesive, a pre-formed adhesive can be applied to a solar cell or solar cell piece. An adhesive can provide for an electrical and mechanical connection between solar cell pieces in a shingled solar cell arrangement.

According to an embodiment, an apparatus is provided. The apparatus includes a first processing line. The first processing line includes a cleaving station adapted for separating a solar cell into two or more solar cell pieces. The apparatus includes a second processing line. The second processing line includes a storing station adapted for storing a plurality of solar cell pieces. The second processing line includes a transportation system adapted for transporting a solar cell piece from the storing station to the first processing line. The transportation system may be adapted for transporting the solar cell piece from the storing station to a first position on the first processing line.

According to a further embodiment, an apparatus is provided. The apparatus includes a cleaving station adapted for separating a solar cell into two or more solar cell pieces. The apparatus includes an assembling station adapted for assembling a solar cell arrangement comprising a plurality of overlapping solar cell pieces. The apparatus includes a first transportation system adapted for transporting solar cell pieces from the cleaving station to the assembling station. The apparatus includes a storing station adapted for storing a plurality of solar cell pieces. The apparatus includes a second transportation system adapted for transporting solar cell pieces from the storing station to the first transportation system.

An apparatus, as described herein, may be an apparatus for processing solar cells. The apparatus may be an apparatus for manufacturing a shingled solar cell arrangement.

FIG. 1 shows an apparatus 100 according to embodiments described herein.

As e.g. shown in FIG. 1, an apparatus 100 may include a first processing line 150 and/or a second processing line 250.

A processing line, as described herein, may include a plurality of processing stations arranged for processing solar cells and/or solar cell pieces. For example, a solar cell and/or solar cell piece may be processed sequentially by respective processing stations arranged on a processing line. The solar cell or solar cell piece may be transported along the processing stations. For example, a solar cell or solar cell piece may be processed by a first processing station of the processing line. After processing by the first processing station, a solar cell or solar cell piece may be transported from the first processing station to a second processing station, e.g. by way of a conveyor. The solar cell or solar cell piece may be subsequently be processed by the second processing station. In some implementations, a solar cell or solar cell piece may subsequently be processed by further processing stations on the processing line, such as e.g. a third processing station, a fourth processing station, and so on.

As e.g. shown in FIG. 1, the first processing line 150 may include a cleaving station 110. Solar cells 1 may be transported to the cleaving station 110. In the cleaving station 110, a solar cell 1 may be separated into a plurality of solar cell pieces, e.g. two three, four or even more solar cell pieces. FIG. 1 shows solar cell pieces 10a which result from cleaving solar cells 1 in the cleaving station 110.

Cleaving a solar cell, as described herein, is performed for separating the solar cell into solar cell pieces, or solar cell shingles. Before cleaving a solar cell, a portion of the solar cell may be scribed, e.g. by a laser. Cleaving a solar cell may be performed at a scribed portion of the solar cell. The scribed portion provides a breaking location which facilitates separating the solar cell into solar cell pieces. The cleaving may include acting on the solar cell, e.g. on a scribed portion of the solar cell, by a force, particularly a substantially vertical force. The force is configured for separating the solar cell into solar cell pieces or solar cell shingles. By applying the force, the solar cell breaks into separate solar cell pieces, wherein the breaking location(s) may be defined by the scribed portion(s) on the solar cell.

The term "solar cell piece", as used herein, is distinguished from the term "solar cell". A solar cell piece, as described herein, refers to a portion or segment of a solar cell. A solar cell piece may be understood as a solar cell segment, or solar cell shingle. A solar cell piece may be a portion of a solar cell resulting from the cleaving of the solar cell. The area of a solar cell piece is smaller than the area of a solar cell. For example, the area of a solar cell piece may be 90% or less of the area of a solar cell. In some cases, a solar cell piece may have an area of 50% or less of the area of a solar cell.

Figure 2A:
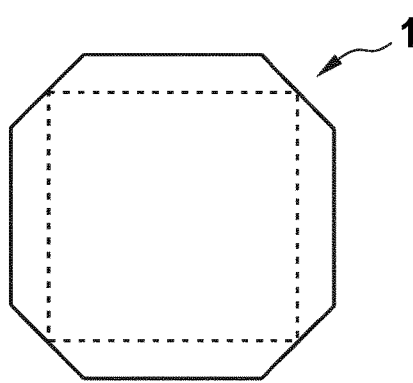
FIG. 2a shows an example of a solar cell according to embodiments described herein.
Figure 2B:
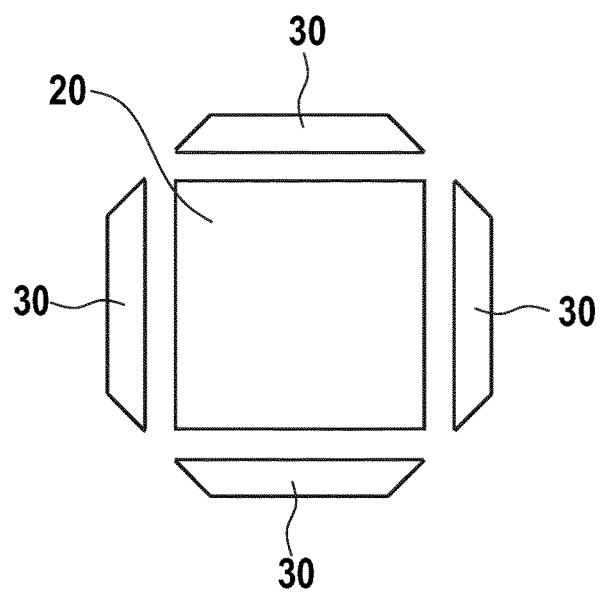
FIG. 2b shows examples of solar cell pieces according to embodiments described herein.

FIG. 2a shows an example of a solar cell 1 as described herein. The dashed lines in FIG. 2a indicate locations at which the solar cell 1 may be cleaved. The cleaving of the solar cell 1 along the dashed lines shown in FIG. 2a separates the solar cell 1 into five solar cell pieces or shingles, namely a rectangular solar cell piece 20 and four smaller trapezoid-shaped solar cell pieces 30, as shown in FIG. 2b.

As e.g. shown in FIG. 1, an apparatus 100 may include an assembling station 120 for assembling a solar cell arrangement comprising a plurality of overlapping solar cell pieces.

As e.g. shown in FIG. 1, the first processing line 150 may include a first transportation system 152 adapted for transporting solar cell pieces from the cleaving station 110 to the assembling station 120. The solar cell pieces 10a may be transported on the first processing line 150 from the cleaving station 110 to the assembling station 120.

A processing line, as described herein, may include a transportation system for transporting solar cells or solar cell pieces along the processing line or along a portion of the processing line. The transportation system may comprise one or more conveyors for transporting the solar cells or solar cell pieces between different processing stations of the processing line. For example, the transportation system may include a first conveyor for transporting a solar cell or solar cell piece from a first processing station of the processing line to a second processing station of the processing line. In some implementations, the transportation system may include a second conveyor for transporting a solar cell or solar cell piece from the second processing station to a third processing station of the processing line. The transportation system may include further conveyors for transporting solar cells or solar cell pieces between further processing stations of the processing line. Alternatively, the transportation system may include a single conveyor for transporting the solar cells or solar cell pieces along a plurality of processing stations. For example, two, three, four or more processing stations of the processing line may be served by a same conveyor.

As e.g. shown in FIG. 1, the second processing line 250 may include a storing station 210, e.g. a buffer, adapted for storing a plurality of solar cell pieces 10b. A storing station 210 may include or be a cassette. In the storing station, a plurality of solar cell pieces 10b may be stacked on top of each other. A storing station 210, as described herein, may include a plurality of solar cell pieces, e.g. 5 or more, 50 or more, 100 or more or even 200 or more solar cell pieces. The plurality of solar cell pieces may be stored in the storing station in a horizontal orientation. The plurality of solar cell pieces may be stacked in the storing station. The plurality of solar pieces may be stored in the storing station in a sunny-up configuration of the solar cell pieces.

As e.g. shown in FIG. 1, the second processing line 250 may include a second transportation system 252. The second transportation system 252 may be adapted for transporting a solar cell piece 10b from the storing station 210 to the first processing line 150. For example, the second transportation system 252 may include a conveyor, or a sequence of conveyors, arranged for guiding a solar cell piece 10b from the storing station 210 to the first processing line 150. FIG. 1 shows a solar cell piece 10b being transported from the storing station 210 towards the first processing line 150 by the second transportation system 252.

The first processing line, as described herein, may not include the storing station 210. The first processing line may not include the second transportation system 252. The storing station 210 and/or the second transportation system 252 may be arranged at a distance from the first processing line.

The second processing line, as described herein, may be different from the first processing line. The second processing line may intersect with the first processing line. The second processing line may not include the cleaving station 110 or any cleaving station. The cleaving station 110 may be arranged at a distance from the second processing line.

FIGS. 3-5 show an exemplary mode of operation of an apparatus 100 according to embodiments described herein.

As e.g. shown in FIG. 3, solar cell pieces 10a provided by the cleaving station 110 may be transported on the first processing line 150 (e.g. by the first transportation system as described herein) from the cleaving station 110 towards the assembling station 120. A solar cell piece 10b provided by the storing station 210 may be transported on the second processing line 250 (e.g. by the second transportation system as described herein) from the storing station 210 towards the first processing line 150. In FIG. 3, the solar cell piece 10b is in a position downstream of the storing station 210 on the second processing line 250 and upstream of a region where the second processing line 250 meets the first processing line 150.

As compared to the position of the solar cell pieces 10a shown in FIG. 3, the solar cell pieces 10a shown in FIG. 4 are in a position further downstream of the cleaving station 110 i.e. closer to the assembling station 120.

The solar cell piece 10b shown in FIG. 4 is in a first position on the first processing line 150.

The first position of the solar cell piece 10b, as described herein, can be a position in a region where the second processing line 250 meets, i.e. intersects with, the first processing line 150. The first position may be a position on the first transportation system. The first transportation system may be adapted for transporting solar cell pieces, e.g. solar cell pieces 10a and/or solar cell pieces 10b, from the first position to the assembling station. The first position may be a position downstream of the cleaving station with respect to a processing flow of the first processing line. The first position may be a position upstream of a curing station and/or upstream of an assembling station with respect to a processing flow of the first processing line.

The solar cell piece 10b shown in FIG. 4 has been transferred from the second processing line 250 to the first processing line 150. In the exemplary embodiment shown in FIG. 4, the solar cell piece 10b on the first processing line 150 is in a position behind the solar cell pieces 10a, i.e. the solar cell pieces 10a are followed by the solar cell piece 10b on the first processing line 150.

The solar cell pieces 10a and the solar cell piece 10b may be transported on the first processing line 150 to the assembling station 120. In the assembling station 120, the solar cell pieces 10a and the solar cell piece 10b may be assembled to form a solar cell arrangement, e.g. a shingled solar cell arrangement. For example, the solar cell pieces 10a and 10b may be electrically and mechanically connected to each other via adhesives, e.g. electrically conducting adhesives, as described herein. After connecting the solar cell pieces together, the shingled solar cell arrangement may be cured.

FIG. 5 shows the apparatus 100 in a state of operation after a solar cell arrangement 40 has been assembled. The solar cell arrangement 40 includes a plurality of overlapping solar cell pieces, namely the solar cell pieces 10a and the solar cell piece 10b. As e.g. shown in FIG. 5, the solar cell piece 10b may be the last solar cell piece of the solar cell arrangement 40. With respect to a process flow of the first processing line 150, the solar cell pieces 10a of the solar cell arrangement 40 may be followed by the solar cell piece 10b.

FIGS. 6-8 show an exemplary mode of operation of an apparatus 100 according to embodiments described herein.

As e.g. shown in FIG. 6, solar cell pieces 10a provided by the cleaving station 110 may be transported on the first processing line 150 from the cleaving station 110 towards the assembling station 120. In the exemplary configuration shown in FIG. 6, the solar cell pieces 10 are in a position on the first processing line 150 upstream of a region where the second processing line 250 meets the first processing line 150. A solar cell piece 10b provided by the storing station 210 is transported on the second processing line 250 from the storing station 210 towards the first processing line 150. In FIG. 6, the solar cell piece 10b is in a position downstream of the storing station 210 and upstream of the region where the second processing line 250 meets the first processing line 150.

As compared to the position of the solar cell pieces 10a shown in FIG. 6, the solar cell pieces 10a shown in FIG. 7 are in a position further downstream of the cleaving station 110 i.e. closer to the assembling station 120. The solar cell piece 10b shown in FIG. 7 is in a first position, as described herein, on the first processing line 150. The solar cell piece 10b has been transferred from the second processing line 250 to the first processing line 150. In the exemplary embodiment shown in FIG. 7, the solar cell piece 10b on the first processing line 150 is in a position preceding the solar cell pieces 10a. The solar cell piece 10b is followed by the solar cell pieces 10a on the first processing line 150.

The solar cell pieces 10a and the solar cell piece 10b may be transported on the first processing line 150 to the assembling station 120. In the assembling station 120, the solar cell pieces 10a and the solar cell piece 10b may be assembled together to form a shingled solar cell arrangement.

FIG. 8 shows the apparatus 100 after a solar cell arrangement 40 has been assembled. The solar cell arrangement 40 includes a plurality of overlapping solar cell pieces, namely the solar cell pieces 10a and the solar cell piece 10b. In the exemplary embodiment illustrated in FIG. 8, the solar cell piece 10b is the leading solar cell piece of the solar cell arrangement 40. With respect to a process flow of the first processing line 150, the solar cell piece 10b is followed by the solar cell pieces 10a.

In a solar cell arrangement 40 comprising a plurality of overlapping solar cell pieces, as described herein, a last solar cell piece and/or a leading solar cell piece of the solar cell arrangement 40 may have a design, or layout, which is different from the design or layout of other, e.g. inner, solar cell pieces of the solar cell arrangement. For example, the last solar cell piece of a solar cell arrangement may include a bus bar on the front side of the solar cell piece, wherein said bus bar has a shape which is different from the shape of the bus bars provided on the respective front sides of the other solar cell pieces of the solar cell arrangement 40. For example, the bus bar on the front side of the last solar cell piece may be wider than the bus bars on the respective front sides of the other solar cell pieces of the solar cell arrangement.

An outermost solar cell piece of a solar cell arrangement 40 having a different design or layout from the other solar cell pieces of the solar cell arrangement 40 may be beneficial, e.g. for connecting the solar cell arrangement 40 to another system, such as a further solar cell arrangement or a further component of a larger solar cell module in which the solar cell arrangement 40 is included. For example, having a wider bus bar on the front side of the last solar cell piece of a solar cell arrangement 40 may be beneficial for connecting, e.g. soldering, the last solar cell piece to other parts of a solar cell module.

Embodiments described herein provide the advantage that solar cell pieces 10b having a specific design tailored to the function of e.g. the last or leading solar cell piece of a solar cell arrangement 40 may be stored in the storing station 210 and supplied on demand to the first processing line 150. For example, in the storing station 210, solar cell pieces 10b having a wide bus bar on the front side may be stored. By supplying such a solar cell piece 10b on demand to the first processing line 150, a solar cell arrangement 40 wherein the last solar cell piece has a wider bus bar on the front side may be manufactured.

In light thereof, embodiments described herein provide for a flexible system for manufacturing a shingled solar cell arrangement, wherein the design of e.g. an outermost solar cell piece of the solar cell arrangement can be tailored to the specific function of the solar cell piece in the system.

FIGS. 3-8 show examples wherein the solar cell piece 10b serves as an outermost solar cell piece of a solar cell arrangement 40, e.g. the last solar cell piece of the solar cell arrangement 40 or the leading solar cell piece of the solar cell arrangement 40. In other implementations, the solar cell piece 10b may also serve as an inner solar cell piece of a solar cell arrangement 40. In further implementations, the processes in question may also be combined with each other.

For example, a solar cell piece 10*b* serving as the leading solar cell piece of a solar cell arrangement 40 and a further solar cell piece 10*b* serving as the last solar cell piece of the solar cell arrangement 40 may both be supplied to the first processing line 150 by the second processing line 250.

A supply of solar cell pieces 10*b* from the storing station 210 to the first processing line 150 may be a controlled supply, such as an "on-demand" supply. A solar cell piece 10*b* may be stored in a storing station 210, e.g. a buffer. The solar cell piece 10*b* may be transported from the storing station 210 to the first processing line 150 in response to an instruction from a control unit included in the apparatus 100. The solar cell piece 10*b* may be transported from the storing station 210 to the first processing line 150 depending on a process condition of the first processing line 150. The process condition may be associated to, or depend on, a position of the solar cell pieces 10*a* on the first processing line. For example, with respect to FIGS. 3-5 and 6-8, as the solar cell pieces 10*a* are transported on the first processing line 150 towards the assembling station 120, an instruction may be sent to the second processing line 250 that a solar cell piece 10*b* stored in the storing station 210 is to be transported from the storing station 210 to the first processing line 150. For example, the instruction may be sent at a time when a last solar cell piece or, alternatively, a leading solar cell piece, for a solar cell arrangement 40 is needed. In response to the instruction, the solar cell piece 10*b* may be retrieved from the storing station 210 and guided from the storing station 210 to the first processing line 150. After the solar cell piece 10*b* has arrived on the first processing line 150, the solar cell piece 10*b* and the solar cell pieces 10*a* may be transported on the first processing line 150 to the assembling station 120 for assembling the solar cell pieces 10*a* and 10*b* into a solar cell arrangement 40, as e.g. described above.

An apparatus, as described herein, may include a control unit for controlling a supply of solar cell pieces from the storing station to the first processing line. The apparatus may be configured for providing a solar cell piece from the storing station to the first processing line in response to an instruction from the control unit. The control unit may be connected to or part of the first processing line. The control unit may be connected to or part of the second processing line. The instruction may be sent by the control unit to the second processing line, particularly to one or more processing stations on the second processing line. For example, the instruction may be sent to the storing station and/or to the second transportation system. A solar cell piece, e.g. a solar cell piece 10*b*, may be retrieved from the storing station for transportation to the first processing line depending on, or in response to, a process condition of the first processing line. The process condition may be associated to, or depend on, a position of one or more solar cell pieces on the first processing line, e.g. one or more solar cell pieces 10*a*.

A storing station 210, as described herein, may include a plurality of solar cell pieces 10*b* stored in the storing station. During the storing of a solar cell piece 10*b* in the storing station 210, the solar cell piece 10*b* may not include an adhesive for connecting the solar cell piece 10*b* to a further solar cell piece.

In some cases, an adhesive may be applied to the solar cell piece 10*b* in a position on the second processing line 250 downstream of the storing station 210. The adhesive may allow for electrically and mechanically connecting the solar cell piece 10*b* to an adjacent solar cell piece in a solar cell arrangement, as described herein. In other cases, no adhesive for connecting the solar cell piece 10*b* to a further solar cell piece is applied to the solar cell piece 10*b*.

For example, in the process illustrated in FIGS. 3-5, each of the solar cell pieces 10*a* may include a respective adhesive, e.g. an electrically conductive adhesive. The adhesives may be provided, e.g. printed, by an adhesive application station arranged on the first processing line 150. For example, the adhesives may be printed on the respective solar cell pieces 10*a* on the first processing line 150 downstream of the cleaving station 110. Alternatively, the adhesives may be printed on one or more solar cells, before said solar cells are cleaved to form the solar cell pieces 10*a*. After the adhesives are provided, e.g. printed, on the solar cells, the solar cells including the adhesives may be cleaved in the cleaving station 110 to form solar cell pieces 10*a* including the adhesives.

In each of the configurations shown in FIGS. 3-5, the solar cell piece 10*b* may not include an adhesive for connecting the solar cell piece 10*b* to an adjacent solar cell piece 10*a* of the solar cell arrangement 40. When assembling the solar cell arrangement 40 shown in FIG. 5, two adjacent solar cell pieces 10*a* of the solar cell arrangement 40 can be connected to each other via an adhesive provided on one of the solar cell pieces 10*a*. The solar cell piece 10*b*, i.e. the last solar cell piece of the solar cell arrangement 40, may be connected to the adjacent solar cell piece 10*a* of the solar cell arrangement 40 via an adhesive provided on the adjacent solar cell piece 10*a*. For example, in the solar cell arrangement 40 shown in FIG. 5, the solar cell piece 10*b* may not include an adhesive for connecting the solar cell piece 10*b* to the adjacent solar cell piece 10*a*. An adhesive on the solar cell piece 10*b* may not be necessary, since an adhesive for connecting the solar cell piece 10*b* and the adjacent solar cell piece 10*a* to each other may be provided on the adjacent solar cell piece 10*a*.

In the process illustrated in FIGS. 6-8, an adhesive may be applied to the solar cell piece 10*b*. The adhesive may be applied to the solar cell piece 10*b* by an adhesive application station 240 arranged on the second processing line 250. The adhesive may be applied to a side of the solar cell piece 10*b* facing upward, e.g. the front side of the solar cell piece 10*b*. The solar cell piece 10*b* including the adhesive is transported from the adhesive application station 240 to the first processing line 150, and then to the assembling station 120.

When assembling the solar cell arrangement 40 shown in FIG. 8, two adjacent solar cell pieces 10*a* of the solar cell arrangement 40 can be connected to each other via an adhesive provided on one of the solar cell pieces 10*a*. The solar cell piece 10*b*, i.e. the leading solar cell piece of the solar cell arrangement 40, may be connected to the adjacent solar cell piece 10*a* of the solar cell arrangement 40 via the adhesive provided on the solar cell piece 10*b*.

A second processing line, as described herein, may include an adhesive application station. The adhesive application station may be downstream of the storing station with respect to a process flow of the second processing line. The second transportation system may be configured for transporting a solar cell piece from the adhesive application station to the first processing line. The adhesive application station may be at a distance from the first processing line.

An adhesive application station on the second processing line, as described herein, may not be an adhesive printing station. The adhesive application station may be an adhesive dispensing station. The adhesive application station, or an adhesive application unit included in the adhesive application station, is adapted for dispensing a pre-formed adhesive. The adhesive application station is adapted for applying a pre-formed adhesive to a solar cell piece. A pre-formed adhesive may be a solid adhesive.

Figure 9:
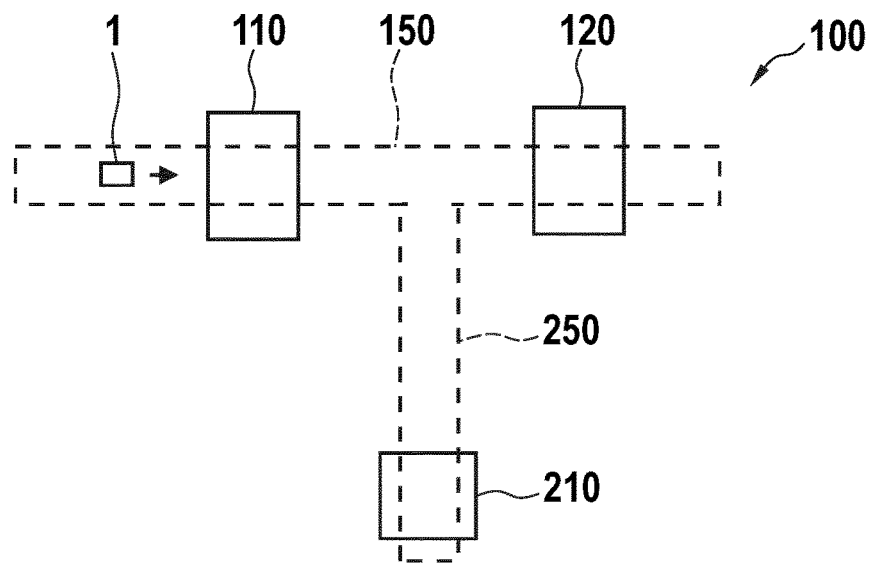
FIGS. 9-11 illustrate the filling of a storing station according to embodiments described herein.
Figure 10:
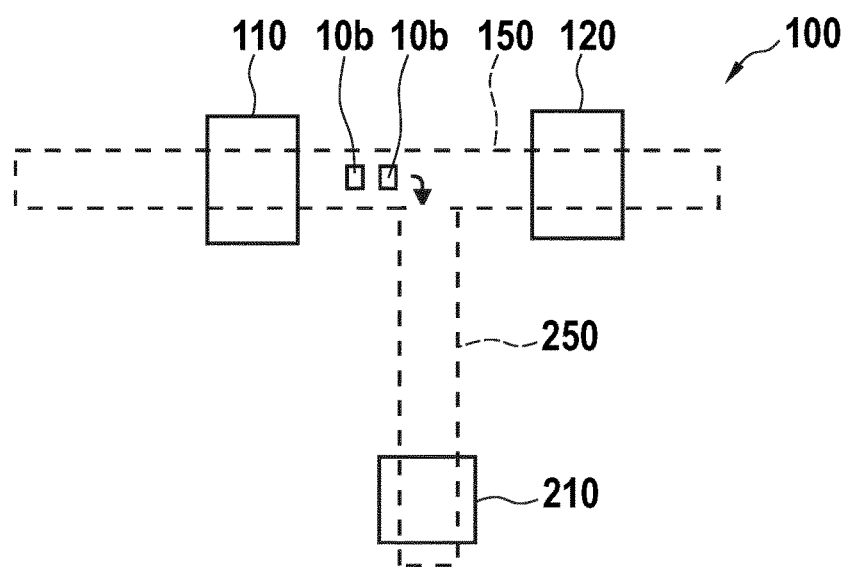
Figure 11:
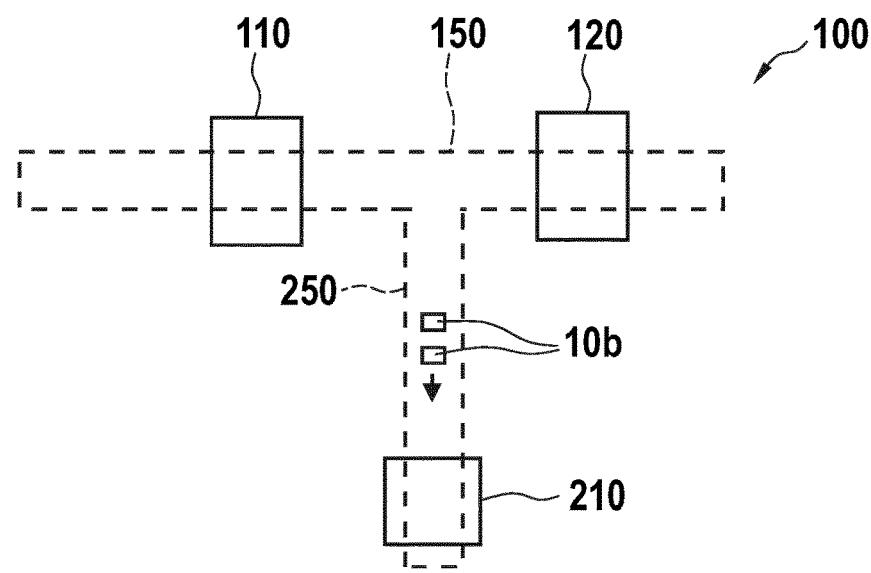

FIGS. 9-11 show a mode of operating an apparatus 100 according to embodiments described herein for filling the storing station 210, e.g. a buffer, with solar cell pieces 10b. The solar cell pieces 10b may at a later stage be retrieved from the storing station 210 and supplied to the first processing line 150, as described herein.

FIG. 9 shows a solar cell 1 moving towards the cleaving station 110 on the first processing line 150. The solar cell 1 may be transported on the first processing line, e.g. by a first transportation system as described herein. The solar cell 1 may be separated into solar cell pieces 10b in the cleaving station 110, as shown in FIG. 10. The solar cell pieces 10b may be transferred from the first processing line 150 to the second processing line 250, as illustrated by the arrow in FIG. 10. The solar cell pieces 10b may be moved on the second processing line 250 to the storing station 210, as shown in FIG. 11. For example, the second transportation system, as described herein, may be adapted for transporting the solar cell pieces 10b from the first processing line 150 to the storing station 210. The solar cell pieces 10b may be stored in the storing station 210. In light thereof, the storing station 210 may be filled with solar cell pieces 10b.

A second transportation system, as described herein, may be a two-way transportation system. The two-way transportation system may be adapted for transporting solar cell pieces from the storing station to the first processing line and from the first processing line to the storing station. The second transportation system may include a first guiding unit configured for transporting a solar cell piece from the storing station to the first processing line. The second transportation system may include a second guiding unit configured for transporting a solar cell piece from the first processing line to the storing station. The first guiding unit may include a first conveyor. The second guiding unit may include a second conveyor. The first guiding unit may be configured for guiding a solar cell piece in a first direction. The second guiding unit may be configured for guiding a solar cell piece in a second direction. The first direction may be opposite to the second direction. Alternatively, the second transportation system may include a conveyor configured for guiding solar cell pieces in a first direction and in a second direction opposite the first direction, e.g. a two-way conveyor.

Embodiments described herein involve processing of solar cells and/or solar cell pieces in a sunny-up configuration of the solar cell pieces.

The processing of solar cell pieces 10a on at least part of the first processing line may be performed in a sunny-up configuration of the solar cell pieces 10a. For example, referring e.g. to FIGS. 3-5 and 6-8, during the cleaving of a solar cell in the cleaving station 110 to separate the solar cell into solar cell pieces 10a, the front side of the solar cell may face upward. During transportation of the solar cell pieces 10a from the cleaving station 110 to the assembling station 120, the respective front sides of the solar cell pieces 10a may face upward.

Additionally or alternatively, processing of the solar cell pieces 10b on at least part of the second processing line 250 may be performed in a sunny-up configuration of the solar cell pieces 10b. For example, during the storing of a solar cell piece 10b in the storing station 210, the front side of the solar cell piece 10b may face upward. During application of an adhesive to the solar cell piece 10b on the second processing line 250, the front side of the solar cell piece 10b may face upward. During transportation of the solar cell piece 10b on the second processing line 250 to the first processing line 150, the front side of the solar cell piece 10b may face upward.

Additionally or alternatively, during the assembling of the solar cell pieces 10a and 10b to form a solar cell arrangement 40 as described herein, the respective front sides of the solar cell pieces 10a and 10b may face upward.

Additionally or alternatively, referring e.g. to FIGS. 9-11, during cleaving of a solar cell in the cleaving station 110 to separate the solar cell into solar cell pieces 10b, the front side of the solar cell may face upward. During transportation of the solar cell pieces 10b from the cleaving station 110 to the storing station 210, the respective front sides of the solar cell pieces 10b may face upward.

A cleaving station, as described herein, may be adapted for cleaving a solar cell in a configuration wherein the front side of the solar cell faces upward. An assembling station, as described herein, may be adapted for assembling a solar cell arrangement comprising a plurality of overlapping solar cell pieces in a configuration wherein the respective front sides of the solar cell pieces face upward. A storing station, as described herein, may be adapted for storing a plurality of solar cell pieces in a configuration wherein the respective front sides of the solar cell pieces face upward. An adhesive application station, as described herein, may be adapted for providing an adhesive to a solar cell piece in a configuration wherein the front side of the solar cell piece faces upward.

Processing the solar cells and/or solar cell pieces in a sunny-up configuration facilitates the implementation of a shingled solar cell arrangement wherein the conductive pattern on the front side of the last solar cell piece of the solar cell arrangement has a specific shape or layout, i.e. a layout tailored to the last solar cell piece, e.g. different from the layout of the conductive patterns on the respective front sides of the other solar cell pieces of the solar cell arrangement. For example, in light of the sunny-up processing, the front side of the last solar cell piece may be easily provided with a bus bar which is wider than the respective bus bars on the front sides of the other solar cell pieces of the solar cell arrangement.

Further, processing a solar cell and/or solar cell piece in a sunny-up configuration facilitates performing a photoluminescence inspection of the solar cell or of pieces of the solar cell, e.g. before or after separating the solar cell into solar cell pieces. Still further, processing the solar cell in a sunny-up configuration facilitates chucking the solar cell, particularly for solar cells with a degree of bowing.

A first processing line, as described herein, may include at least one of the following: a scribing station; a flipping station; an adhesive application station; a curing station; an assembling station; or any combination thereof.

Figure 12:
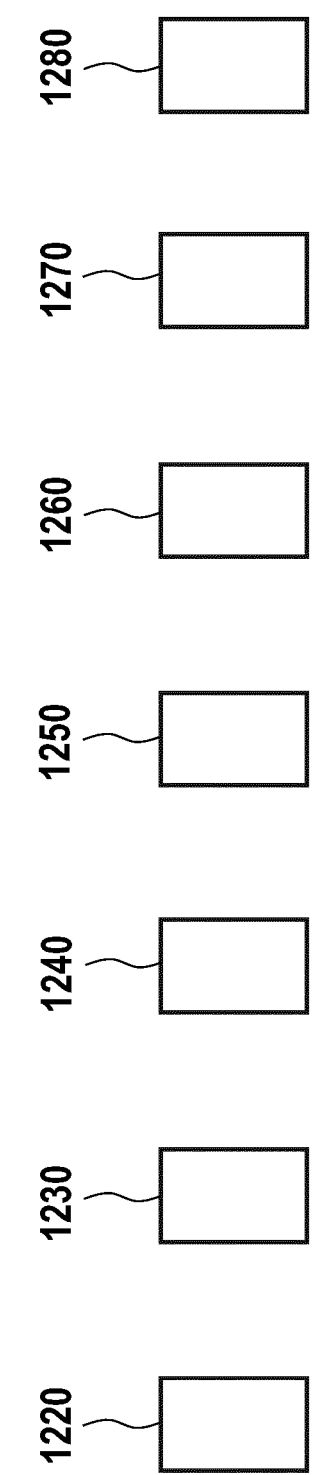
FIG. 12 shows an example of a first processing line according to embodiments described herein.

FIG. 12 shows a first processing line 150 according to embodiments described herein.

As shown in e.g. FIG. 12, a first processing line 150 may include processing stations 1220, 1230, 1240, 1250, 1260, 1270 and/or 1280. A first processing line 150 according to embodiments described herein need not include all of the processing stations depicted in FIG. 12. The first processing line 150 may include only some of the processing stations.

In FIG. 12, solar cells and/or solar cell pieces may be processed from left to right. The processing station 1230 may be provided downstream of the processing station 1220 with respect to a processing flow of the first processing line 150; the processing station 1240 may be provided downstream of the processing station 1230; the processing station 1250 may be provided downstream of the processing station 1240; and so on.

Alternatively, the order in which the processing stations shown in FIG. 12 are arranged on the first processing line 150 may be changed.

Processing station 1220 may be a storing station for storing a plurality of solar cells. A plurality of solar cells may be stored and/or stacked in processing station 1220.

Processing station 1230 may be a scribing station. Processing station 1230 may include a scribing unit for scribing solar cells or solar cell pieces as described herein.

Processing station 1240 may be a flipping station. Processing station 1240 may include a flipping unit. A flipping unit may be configured for turning over a solar cell.

Processing station 1250 may be an adhesive application station. Processing station 1250 may include an adhesive application unit, e.g. an adhesive printing unit, as described herein.

Processing station 1260 may be a cleaving station as described herein. Processing station 1260 may be cleaving station 110. Processing station 1260 may include a cleaving unit. A cleaving station as described herein may include a cleaving unit for separating a solar cell into a plurality of solar cell pieces, or shingles. For example, the cleaving unit can be configured for cleaving the solar cell by applying a substantially vertical force to the solar cell.

Processing station 1270 may be an assembling station as described herein.

Processing station 1270 may be the assembling station 120. Processing station 1270 may include an assembling unit. An assembling station may include an assembling unit configured for connecting a plurality of solar cell pieces to each other to form a solar cell arrangement of overlapping solar cell pieces.

Processing station 1280 may be a curing station. Processing station 1280 may include a curing unit. An apparatus, as described herein, may include a curing unit. The curing unit may be included in a curing station or in an assembling station as described herein. The curing unit may be configured for curing a solar cell arrangement of overlapping solar cell pieces. The apparatus may be configured such that, during the curing of a solar cell arrangement, the front side of the solar cell arrangement faces upward. A curing unit may include a heating device. A heating device can be selected from the group consisting of conduction heaters (e.g., hot plates), convective heaters, resistive heaters, infrared heaters, lamp heaters, hot air heaters, and any combination thereof.

Figure 13:
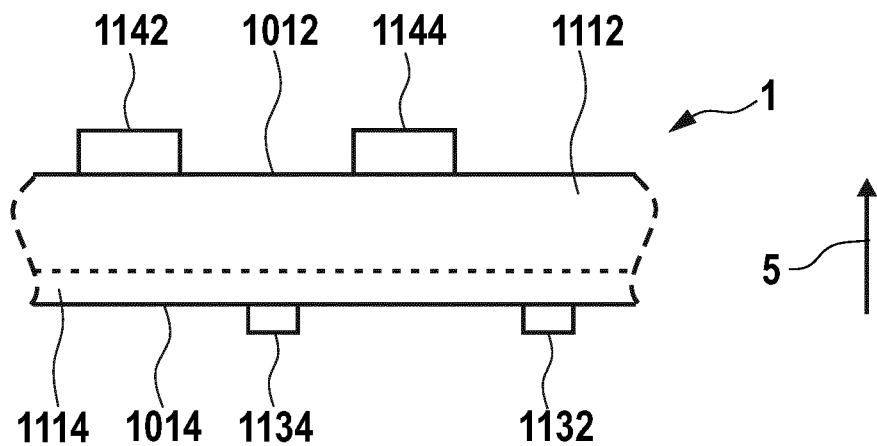
FIG. 13 shows an example of a solar cell according to embodiments described herein.

FIG. 13 shows a solar cell 1 according to embodiments described herein.

As e.g. shown in FIG. 13, a solar cell 1 may include a photovoltaic area 1114. The photovoltaic area 1114 is configured for receiving sunlight for converting the sunlight into electrical power. The photovoltaic area 1114 defines the front side 1014 of the solar cell 1.

As e.g. shown in FIG. 13, a solar cell 1 may include a bus bar 1132 and/or a bus bar 1134. The bus bar 1132 and/or the bus bar 1134 may be provided on the front side 1014 of the solar cell 1. The bus bars 1132 and 1134 are examples of sunny-side bus bars as described herein. A solar cell 1 may include a conductive pattern or conductive structure including further bus bars and/or a plurality of fingers on the front side 1014 of the solar cell 1.

As e.g. shown in FIG. 13, a solar cell 1 may include a backside area 1112. The backside area 1112 defines the backside 1012 of the solar cell 1. As e.g. shown in FIG. 13, a solar cell 1 may include a bus bar 1142 and/or a bus bar 1144. The bus bar 1142 and/or the bus bar 1144 are provided on the back side 1012 of the solar cell 1. The bus bars 1142 and 1144 are examples of backside bus bars as described herein.

A storing station on the first processing line, e.g. processing station 1220 shown in FIG. 12, may store a plurality of solar cells such as the solar cell 1 shown in FIG. 13.

Figure 14:
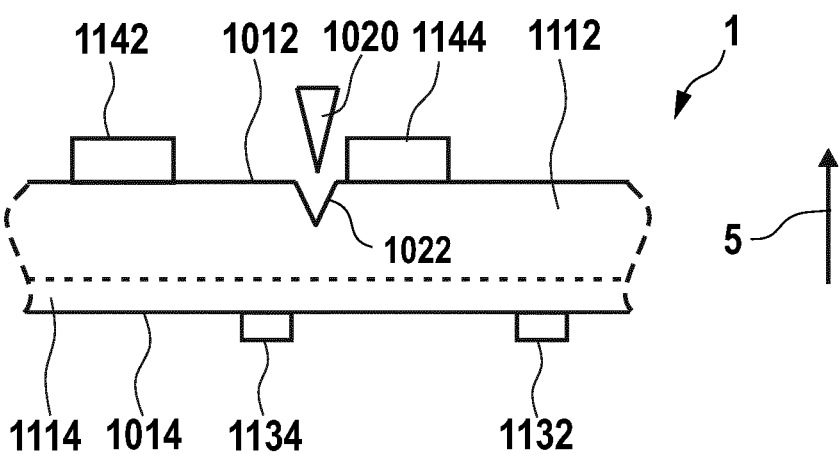
FIG. 14 illustrates the scribing of a solar cell according to embodiments described herein.

FIG. 14 illustrates scribing a portion of a solar cell 1 according to embodiments described herein.

As e.g. shown in FIG. 14, a portion 1022 of the backside area 1112 may be scribed. The scribing may be performed from above the solar cell 1. As shown, the scribing may be performed by a laser beam 1020. A portion 1022, e.g. a groove extending in a direction perpendicular to the drawing plane, may be scribed in the backside area 1112. The scribed portion 1022 defines a breaking location for separating the solar cell 1 into separate solar cell pieces.

As e.g. shown in FIG. 14, a scribed portion 1022 may be between the bus bar 1142 and the bus bar 1144.

The scribing of a solar cell, as described herein, may be performed by a scribing station as described herein. The scribing station may be on the first processing line. The scribing may be performed by a scribing unit. The scribing unit may be included in the scribing station. For example, the scribing unit may be included in processing station 1230.

In FIGS. 13 and 14, the solar cell 1 is shown in a sunny-down configuration, wherein the front side 1014, or sunny side, of the solar cell faces downward. The back side 1012 of the solar cell 1 faces upward.

Figure 15:
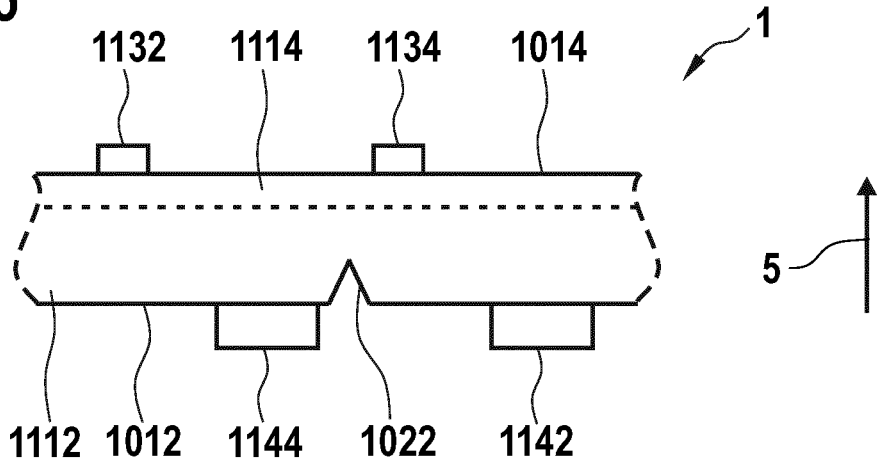
FIG. 15 illustrates the flipping over of a solar cell according to embodiments described herein.

FIG. 15 shows a solar cell 1 similar to the solar cell 1 shown in FIG. 14. The solar cell 1 shown in FIG. 15 is in a sunny-up configuration, wherein the front side, or sunny side, of the solar cell faces upward. The back side faces downward. As compared to the solar cell 1 in the sunny-down position shown in FIG. 14, the solar cell 1 shown in FIG. 15 has been turned over, i.e. flipped over, to provide the solar cell 1 in a sunny-up position as shown in FIG. 15.

A solar cell may be turned over, or flipped over, in or at a flipping station. The flipping station may be on the first processing line. The flipping station may include a flipping unit. A solar cell may be flipped over by the flipping unit. For example, the flipping unit may be included in processing station 1240.

Figure 16:
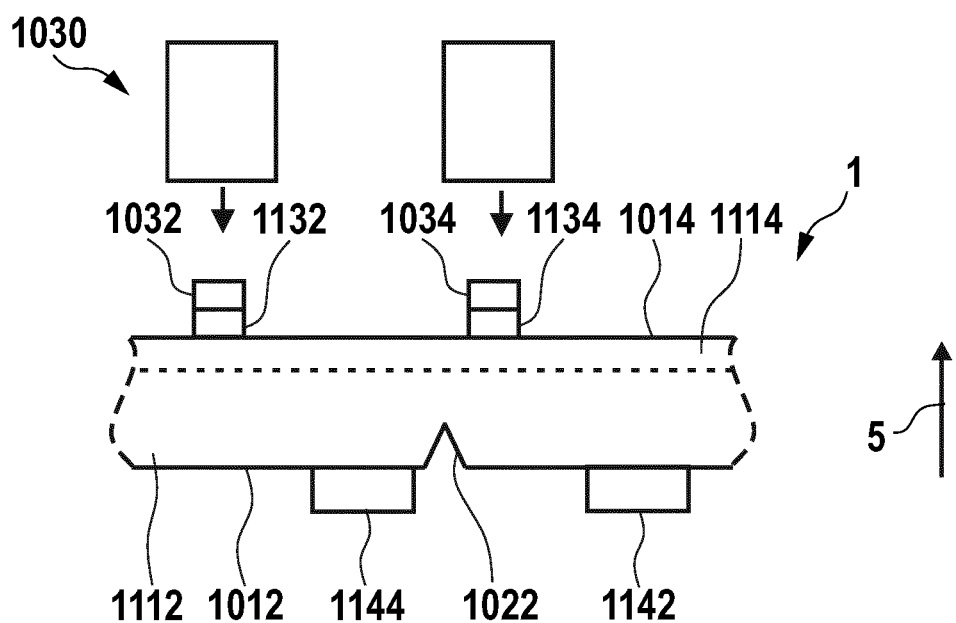
FIG. 16 illustrates providing adhesives on a solar cell according to embodiments described herein.

FIG. 16 shows a solar cell 1 during processing in an adhesive application station. The adhesive application station may be on the first processing line. For example, the adhesive application station may be processing station 1250.

As e.g. shown in FIG. 16, an adhesive application station on the first processing line may include an adhesive application unit 1030. The adhesive application unit 1030 shown in FIG. 16 is configured to provide at least adhesives 1032 and 1034 on the solar cell 1. The adhesive application unit 1030 can be an adhesive printing unit configured for printing the adhesives on the solar cell 1. The adhesives 1032 and 1034 are provided on the front side 1014 of the solar cell 1.

As e.g. shown in FIG. 16, the adhesive 1032 may be provided on the bus bar 1132. The adhesive 1034 may be provided on the bus bar 1134. In FIG. 16, the solar cell 1 is in a sunny-up configuration, similar to the solar cell 1 shown in FIG. 15.

Figure 17:
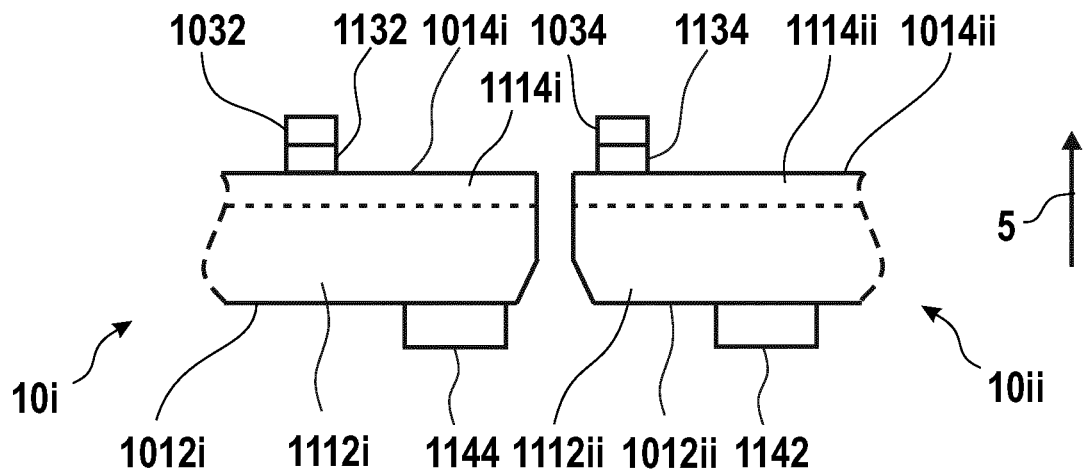
FIG. 17 illustrates the cleaving of a solar cell according to embodiments described herein.

FIG. 17 illustrates separation of a solar cell 1 into solar cell pieces at a cleaving station according to embodiments described herein. The cleaving station may be on the first processing line. The solar cell may be cleaved by a cleaving unit included in the cleaving station. For example, the cleaving station may be processing station 1260.

FIG. 17 shows a solar cell piece 10*i* and a solar cell piece 10*ii*. The solar cell piece 10*i* and the solar cell piece 10*ii* can be provided by separating the solar cell 1 shown in FIG. 16 into pieces. The solar cell 1 can be separated into the solar cell pieces 10*i* and 10*ii* by applying a force to the solar cell 1. The force can be applied to e.g. the backside area 1112. The force can be applied at the scribed portion 1022. The force can be a substantially vertical force, e.g. substantially parallel to direction 5. While applying a force to a solar cell 1 for separating the solar cell 1 into solar cell pieces, the solar cell 1 can be in a sunny-up configuration.

As e.g. shown in FIG. 17, a solar cell piece 10*i* may include a portion 1114*i* of the photovoltaic area 1114. The solar cell piece 10*i* may include a portion 1112*i* of the backside area 1112. The solar cell piece 10*i* may include the adhesive 1032. The solar cell piece 10*i* may include the bus bar 1132. The solar cell piece 10*i* may include the bus bar 1144.

As e.g. shown in FIG. 17, a solar cell piece 10*ii* may include a portion 1114*ii* of the photovoltaic area 1114. The solar cell piece 10*ii* may include a portion 1112*ii* of the backside area 1112. The solar cell piece 10*ii* may include the adhesive 1034. The solar cell piece 10*ii* may include the bus bar 1134. The solar cell piece 10*ii* may include the bus bar 1142.

As e.g. shown in FIG. 17, a solar cell piece 10*i* may have a back side 1012*i* and a front side 1014*i* opposite the back side 1012*i*. The front side and the back side of the solar cell piece 10*i* correspond to the front side and the back side, respectively, of the solar cell 1 from which the solar cell piece 10*i* was obtained.

As e.g. shown in FIG. 17, a solar cell piece 10*ii* may have a back side 1012*ii* and a front side 1014*ii* opposite the back side 1012*ii*. The front side and the back side of the solar cell piece 10*ii* correspond to the front side and the back side, respectively, of the solar cell 1 from which the solar cell piece 10*ii* was obtained.

A solar cell piece 10*a*, as described herein, may be obtained by performing at least the operations shown in FIGS. 13-17, or by performing at least some of these operations. A solar cell piece 10*b*, as described herein, may be obtained by performing at least the operations shown in FIGS. 13-15 and 17, or by performing at least some of these operations. A solar cell piece 10*b* may be provided without the application of an adhesive as e.g. shown in FIG. 16.

Figure 18:
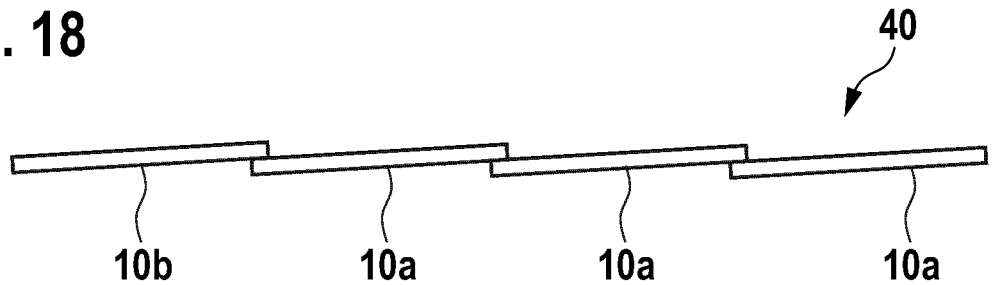
FIG. 18 illustrates the assembly of a solar cell arrangement according to embodiments described herein.

FIG. 18 illustrates the assembly of solar cell pieces according to embodiments described herein. The solar cell pieces may be assembled in an assembling station. The assembling station may be on the first processing line. For example, the assembling station may be processing station 1270.

FIG. 18 shows a plurality of solar cell pieces 10*a* and a solar cell piece 10*b*. The solar cell pieces 10*a* and 10*b* are assembled to form a solar cell arrangement 40 comprising partially overlapping solar cell pieces, such as a shingled solar cell arrangement. As shown, the solar cell arrangement 40 can have a step-like profile.

As e.g. shown in FIG. 18, a solar cell piece 10*b* may be attached to an adjacent solar cell piece 10*a* of the solar cell arrangement 40 via an adhesive (not shown), e.g. an adhesive provided on the adjacent solar cell piece 10*a*. For example, a peripheral portion of the solar cell piece 10*b* may overlap with a peripheral portion of the adjacent solar cell piece 10*a*. Two adjacent solar cell pieces 10*a* of the solar cell arrangement 40 may likewise be connected to each other via an adhesive.

As e.g. shown in FIG. 18, a solar cell piece 10*b* may be the last solar cell piece of the solar cell arrangement 40. Alternatively, the solar cell piece 10*b* may also be the leading solar cell piece or an inner solar cell piece of the solar cell arrangement. The assembling of the solar cell pieces may be performed in a sunny-up configuration of the solar cell pieces.

Figure 19:
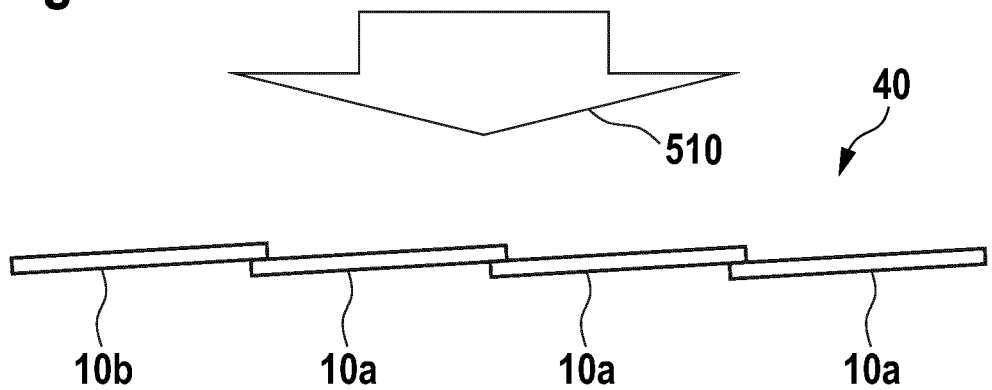
FIG. 19 illustrates the curing of a solar cell arrangement according to embodiments described herein.

FIG. 19 shows the solar cell arrangement 40 of FIG. 18 during a curing operation according to embodiments described herein. The curing operation may be performed by a curing unit. The curing operation may be performed in a curing station, e.g. processing station 1280. The curing station may be on the first processing line. The curing station may include the curing unit. Alternatively, the curing unit may be part of an assembling station. A curing operation is indicated in FIG. 19 by the arrow 510. The curing operation may be performed for curing the adhesives connecting the solar cell pieces with each other. By curing the adhesives, a strong bond between the solar cell pieces is provided. In the exemplary embodiment shown in FIG. 19, the curing of the solar cell arrangement is performed in a sunny-up configuration of the solar cell pieces.

Figure 20:
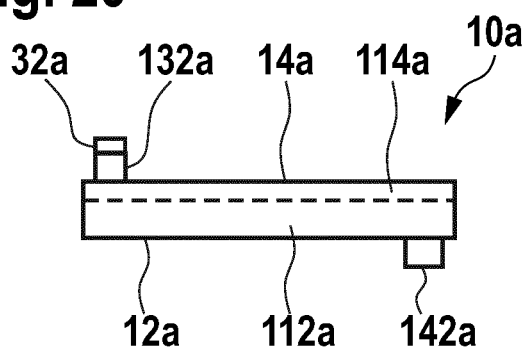
FIGS. 20-21 show examples of solar cell pieces according to embodiments described herein.

FIG. 20 shows an example of a solar cell piece 10*a*. The solar cell piece 10*a* has a back side 12*a* and a front side 14*a* opposite the back side 12*a*. The solar cell piece 10*a* includes a photovoltaic area 114*a*. The solar cell piece 10*a* includes a backside area 112*a*.

As shown in e.g. FIG. 20, a solar cell piece 10*a* may include a bus bar 132*a*. The bus bar 132*a* may be provided on the front side of the solar cell piece 10*a*. The solar cell piece 10*a* may include a bus bar 142*a*. The bus bar 142*a* may be provided on the back side of the solar cell piece 10*a*.

As shown in e.g. FIG. 20, a solar cell piece 10*a* may include an adhesive 32*a*. The adhesive 32*a* may be provided on the front side of the solar cell piece 10*a*. The adhesive 32*a* may be provided on the bus bar 132*a*.

Figure 21:
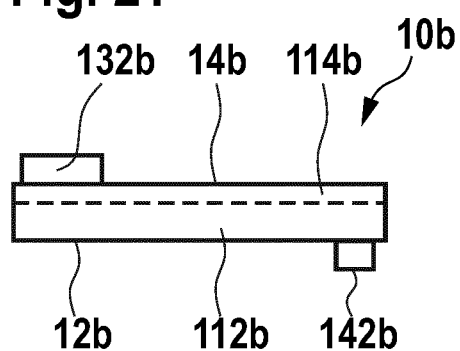

FIG. 21 shows an example of a solar cell piece 10*b*. The solar cell piece 10*b* may serve as a last solar cell piece of a solar cell arrangement, as described herein. The solar cell piece 10*b* shown in FIG. 21 has a back side 12*b* and a front side 14*b* opposite the back side 12*b*. The solar cell piece 10*b* includes a photovoltaic area 114*b*. The solar cell piece 10*b* includes a backside area 112*b*.

As e.g. shown in FIG. 21, a solar cell piece 10*b* may include a bus bar 132*b*. The bus bar 132*b* may be provided on the front side of the solar cell piece 10*b*. The solar cell piece 10*b* may include a bus bar 142*b*. The bus bar 142*b* may be provided on the back side of the solar cell piece 10*b*.

As e.g. shown in FIG. 21, a solar cell piece 10*b* may not include an adhesive for connecting the solar cell piece 10*b* to a further solar cell piece. Particularly, the solar cell piece 10*b* may not include an adhesive on the bus bar 132*b*.

As e.g. shown in FIGS. 20-21, a bus bar 132*b* on the front side of the solar cell piece 10*b* may be wider than a bus bar 132*a* on the front side of the solar cell piece 10*a*.

Figure 22:
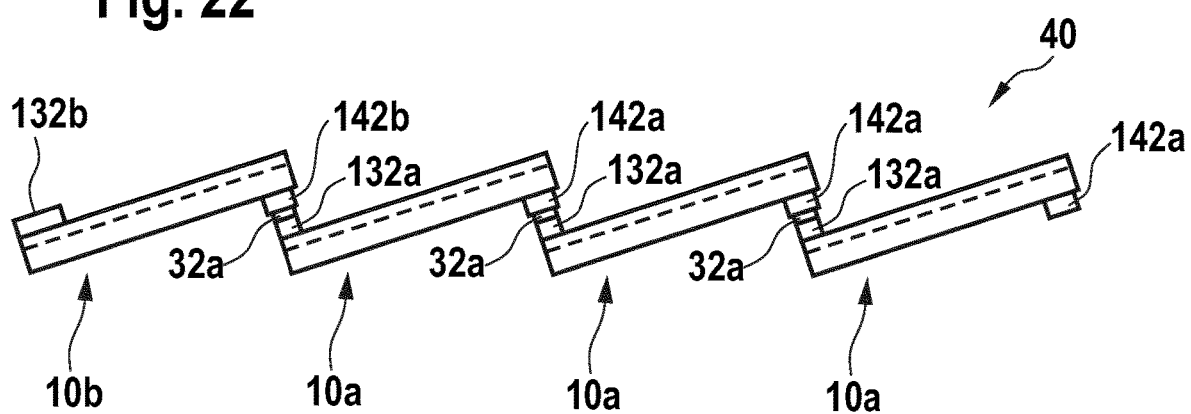
FIGS. 22-23 show examples of a solar cell arrangement according to embodiments described herein.

FIG. 22 shows a solar cell arrangement 40, e.g. a shingled solar cell arrangement, according to embodiments described herein. The shingled solar cell arrangement can be manufactured according to embodiments of the method described herein. The solar cell arrangement 40 includes a plurality of solar cell pieces 10*a*. Each solar cell piece 10*a* shown in FIG. 22 can be a solar cell piece as shown in FIG. 20. The rightmost solar cell piece 10*a* shown in FIG. 22 is the leading solar cell piece of the solar cell arrangement 40.

The solar cell arrangement 40 shown in FIG. 22 includes a solar cell piece 10*b*. The solar cell piece 10*b* can be a solar cell piece 10*b* as shown in FIG. 21. The solar cell piece 10*b* shown in FIG. 22 is the last solar cell piece of the solar cell arrangement 40.

As e.g. shown in FIG. 22, in a solar cell arrangement 40, a solar cell piece 10*b* may be connected to an adjacent solar cell piece 10*a*. The solar cell piece 10*b* may be connected to the adjacent solar cell piece 10*a* by an adhesive 32*a* provided on the front side of the adjacent solar cell piece 10*a*. The adhesive 32*a* may connect the bus bar 142*b* on the back side of the solar cell piece 10*b* to the bus bar 132*a* on the front side of the adjacent solar cell piece 10*a*.

Figure 23:
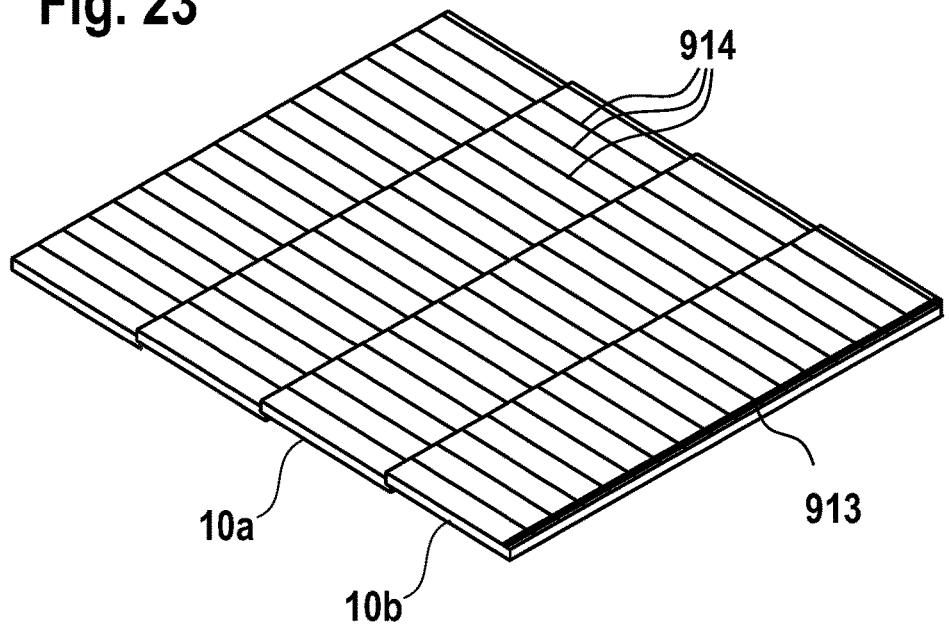

FIG. 23 shows a solar cell arrangement according to embodiments described herein. The solar cell arrangement can be manufactured according to embodiments of the method described herein. The shingled solar cell arrangement shown in FIG. 23 includes a string of partially overlapping solar cell pieces. The shingled solar cell arrangement includes a solar cell piece 10*a*, a solar cell piece 10*b*, and further solar cell pieces. Solar cell piece 10*b* is the last solar cell piece of the shingled solar cell arrangement. A solar cell piece can include a conductive pattern, e.g. a plurality of fingers 914 and/or one or more bus bars on the front side and/or the back side of the solar cell piece.

As e.g. shown in FIG. 23, a solar cell piece 10*b* may include a bus bar 913 on the front side of the solar cell piece 10*b*. The bus bar 913 may be a wide bus bar as described herein.

Figure 24:
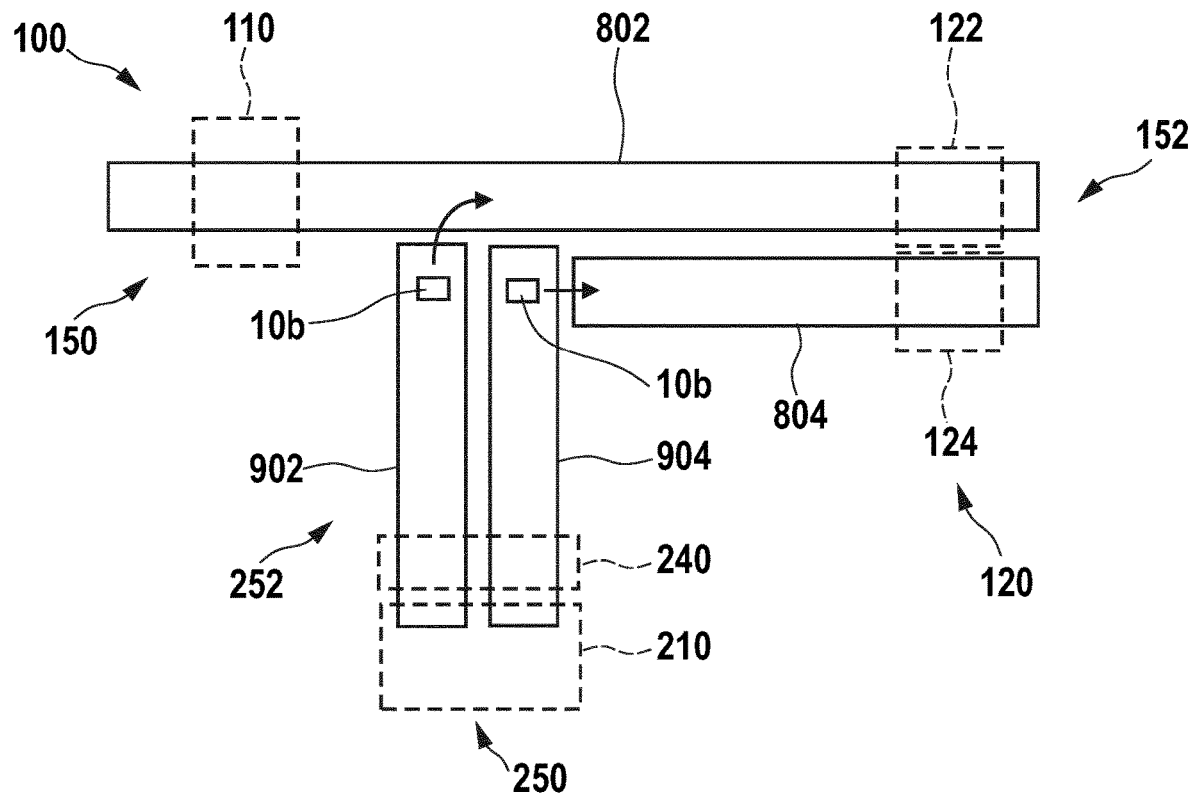
FIGS. 24-25 show an example of an apparatus according to embodiments described herein.
Figure 25:
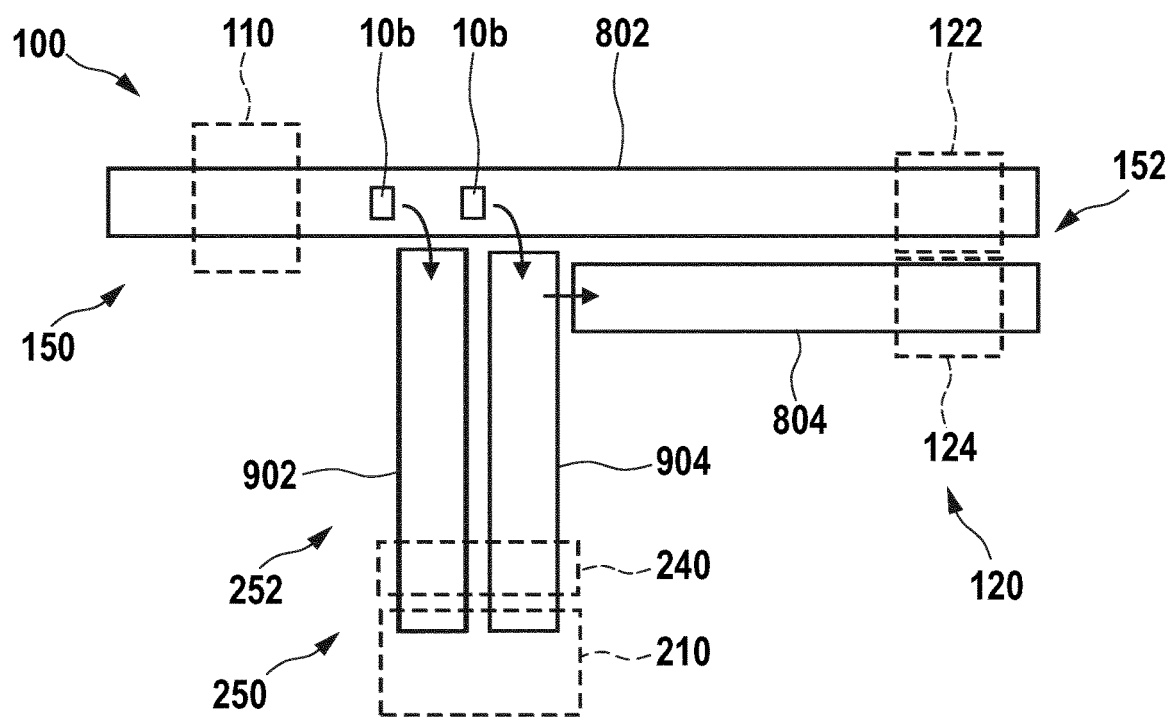

FIGS. 24-25 show an apparatus 100 according to embodiments described herein.

As e.g. shown in FIGS. 24-25, a first transportation system 152 may include a first guiding unit 802, e.g. a first conveyor, and a second guiding unit 804, e.g. a second conveyor. The first guiding unit 802 may be parallel to the second guiding 804.

As e.g. shown in FIGS. 24-25, an assembling station 120 may include a first assembling unit 122 and a second assembling unit 124. The first guiding unit 802 may be adapted for guiding solar cell pieces from the cleaving station 110 to the first assembling unit 122. The second guiding unit 804 may be adapted for guiding solar cell pieces to the second assembling unit 124. The apparatus 100 may include a transfer system (not shown) for transferring solar cell pieces from the first guiding unit 802 to the second guiding unit 804. For example, solar cell pieces provided by the cleaving station 110 may be transported over a first distance on the first processing line by the first guiding unit 802. Some solar cell pieces may continue on the first guiding unit 802 to the first assembling unit 122. For example, rectangular shaped solar cell pieces, as e.g. shown in FIG. 2*b*, may continue on the first guiding unit 802 to the first assembling unit 122. Other solar cell pieces may be transferred from the first guiding unit 802 to the second guiding unit 804 and subsequently be guided by the second guiding unit 804 to the second assembling unit 124. For example, trapezoid shaped solar cell pieces, as e.g. shown in FIG. 2*b*, may be transferred from the first guiding unit 802 to the second guiding unit 804.

As e.g. shown in FIGS. 24-25, a second transportation system 252 may include a first guiding unit 902, e.g. a first conveyor, and a second guiding unit 904, e.g. a second conveyor. The first guiding unit 902 may be parallel to the second guiding unit 904. The first guiding unit 902 may be a two-way guiding unit adapted for guiding solar cell pieces in a first direction and a second direction opposite the first direction. The second guiding unit 902 may be a two-way guiding unit adapted for guiding solar cell pieces in the first direction and the second direction opposite the first direction.

As e.g. shown in FIG. 24, the first guiding unit 902 may be adapted for transporting a solar cell piece 10*b*, e.g. a rectangular shaped solar cell piece, from the storing station 210 to the first processing line, particularly to the first guiding unit 802. A shingled solar cell arrangement made of e.g. rectangular shaped solar cell pieces may be assembled by the first assembling unit 122. The second guiding unit 904 may be adapted for transporting a solar cell piece 10*b*, e.g. a trapezoid shaped solar cell piece, from the storing station 210 to the first processing line, particularly to the second guiding unit 804. A shingled solar cell arrangement made of e.g. trapezoid shaped solar cell pieces may be assembled by the second assembling unit 124.

As e.g. shown in FIG. 25, the first guiding unit 902 may be adapted for transporting a solar cell piece 10*b*, e.g. a rectangular shaped solar cell piece, from the first processing line, particularly from the first guiding unit 802, to the storing station 210. The solar cell piece 10*b* may be stored in a first storing unit of the storing station 210.

As e.g. shown in FIG. 25, the second guiding unit 904 may be adapted for transporting a solar cell piece 10*b*, e.g. a trapezoid shaped solar cell piece, from the first processing line, particularly from the first guiding unit 802, to the storing station 210. The solar cell piece 10*b* may be stored in a second storing unit of the storing station 210.

According to a further embodiment, a method for manufacturing a solar cell arrangement is provided. The method includes separating a solar cell into two or more solar cell pieces, the two or more solar cell pieces including a first solar cell piece. The method includes transporting the first solar cell piece to an assembling station 120. The method includes storing a second solar cell piece in a storing station 210. The method includes transporting the second solar cell piece from the storing station to the assembling station. The method includes assembling a solar cell arrangement 40 comprising a plurality of overlapping solar cell pieces. The solar cell arrangement includes the first solar cell piece and the second solar cell piece.

A solar cell piece 10*a*, as shown in the figures, is an example of a first solar cell piece as described herein. A solar cell piece 10*b*, as shown in the figures, is an example of a second solar cell piece as described herein.

The separation of a solar cell into the two or more solar cell pieces may be performed in a cleaving station as described herein. The assembling of a solar cell arrangement may be performed in an assembling station, as described herein.

Transporting the first solar cell piece to the assembling station may include transporting the first solar cell piece from a cleaving station to the assembling station. Transportation of the first solar cell piece to the assembling station may be provided by a first transportation system as described herein. Transporting the first solar cell piece to the assembling station may include transporting the first solar cell piece on a first processing line as described herein.

Transporting the second solar cell piece from the storing station to the assembling station may include transporting the second solar cell piece on a second processing line, as described herein, and/or transporting the second solar cell piece on a first processing line, as described herein. Transportation of the second solar cell piece on the second processing line may be followed by transportation of the second solar cell piece on the first processing line. Transporting the second solar cell piece from the storing station to the assembling station may include transporting the second solar cell piece by a second transportation system, as described herein, and/or transporting the second solar cell piece by a first transportation system, as described herein. Transportation of the second solar cell piece by the second transportation system may be followed by transportation of the second solar cell piece by the first transportation system.

For example, transporting the second solar cell piece from the storing station to the assembling station may include transporting, e.g. by the second transportation system, the second solar cell piece from the storing station to a first position on the first processing line. The first position may be a position downstream of a cleaving station with respect to a processing flow of the first processing line. The second solar cell piece may be transported, e.g. by the second transportation system, from the storing station to the first transportation system. The first position may be a position on the first transportation system.

Additionally or alternatively, transporting the second solar cell piece from the storing station to the assembling station may include transporting, e.g. by the first transportation system, the second solar cell piece from the first position on the first processing line to the assembling station.

A method, as described herein, may include storing a plurality of solar cell pieces, e.g. a plurality of solar cell pieces 10b, in the storing station. The plurality of solar cell pieces may include the second solar cell piece.

A method, as described herein, may include providing the second solar cell piece by separating a further solar cell into two or more further solar cell pieces, the two or more further solar cell pieces including the second solar cell piece. The method may include transporting the second solar cell piece to the storing station. Separation of the further solar cell into two or more further solar cell pieces may be performed in a cleaving station as described herein. Transporting the second solar cell piece to the storing station may include transporting the second solar cell piece from the cleaving station to the storing station. Transporting the second solar cell piece to the storing station may include transporting the second solar cell piece from the first processing line to the storing station. Transporting the second solar cell piece to the storing station may include transporting the second solar cell piece by a second transportation system as described herein. The second transportation system may be a two-way transportation system adapted for transporting solar cell pieces from the storing station to the first processing line and from the first processing line to the storing station.

During the storing of the second solar cell piece, the second solar cell piece may not include an adhesive for connecting the second solar cell piece to a further solar cell piece, such as an electrically conductive adhesive, as described herein. A method as described herein may include providing an adhesive on the second solar cell piece. The adhesive may be applied to the second solar cell piece in a position on the second processing line. The adhesive may be applied to the second solar cell piece in a position downstream of the storing station relative to a processing flow of the second processing line. The adhesive may be a pre-formed adhesive as described herein. When the adhesive is applied to the second solar cell piece, the adhesive may be in a solid form. The method may include dispensing the adhesive, e.g. a pre-formed solid adhesive. The method may include applying the dispensed adhesive to the second solar cell piece.

A solar cell or solar cell piece, as described herein, may include a conductive structure or a conductive pattern, particularly a conductive line pattern. A conductive pattern or structure can include one or more bus bars and/or a plurality of fingers. The solar cell or solar cell piece can include a conductive pattern or structure on the front side of the solar cell or solar cell piece. Additionally or alternatively, a solar cell or solar cell piece can include a conductive pattern or structure on the back side of the solar cell or solar cell piece. For example, a solar cell or solar cell piece can include a first conductive pattern including one or more bus bars and a plurality of fingers on the front side of the solar cell or solar cell piece. The solar cell or solar cell piece can include a second conductive pattern including one or more bus bars on the back side of the solar cell or solar cell piece.

Providing an adhesive on a solar cell or solar cell piece can include providing the adhesive on the front side of the solar cell or solar cell piece. The adhesive may be provided on at least a portion of a conductive structure or pattern of the solar cell or solar cell piece, particularly a conductive pattern or structure on the front side of the solar cell or solar cell piece. Providing the adhesive on the solar cell or solar cell piece may include providing the adhesive on a bus bar of the solar cell or solar cell piece. The adhesive may be provided on a bus bar, wherein the bus bar is provided on a photovoltaic area of the solar cell or solar cell piece.

According to embodiments described herein, a supply of solar cell pieces 10b from the storing station to the assembling station may be a controlled supply, such as an "on-demand" supply. A method as described herein may include controlling a supply of solar cell pieces from the storing station to the assembling station. The second solar cell piece, e.g. solar cell piece 10b shown in the figures, may be transported from the storing station to the assembling station in response to an instruction from a control unit as described herein.

A method, as described herein, includes separating a solar cell into two or more solar cell pieces, the two or more solar cell pieces including the first solar cell piece. The method may include: scribing the solar cell; applying one or more adhesives to the solar cell; turning the solar cell upside down; or any combination thereof.

The scribing of a solar cell, as described herein, may include a process in which part of the material of the solar cell is removed from the solar cell, e.g. by a laser.

A method, as described herein, may include curing a solar cell arrangement of partially overlapping solar cell pieces. The curing of the solar cell arrangement may be or include a curing of one or more adhesives of the solar cell arrangement. The curing may include a drying process for drying the one or more adhesives. The curing may include heating at least a portion of the solar cell arrangement, e.g. one or more portions corresponding to one or more overlapping regions of adjacent solar cell pieces of the solar cell arrangement.

A configuration wherein the front side, or sunny side, of a solar cell or solar cell piece faces upward is referred to herein as a sunny-up configuration. Embodiments described herein provide a method for processing solar cell or solar cell pieces, wherein several parts of the method are performed in a sunny-up configuration of the solar cell.

During the separation of a solar cell into two or more solar cell pieces, e.g. by a cleaving station as described herein, the front side of the solar cell may face upward. Additionally or alternatively, during the transportation of the first solar cell piece to an assembling station, as described herein, the front side of the first solar cell piece may face upward. Additionally or alternatively, during the storing of the second solar cell piece in a storing station, as described herein, the front side of the second solar cell piece may face upward. Additionally or alternatively, during transportation of the second solar cell piece from the storing station to the assembling station, as described herein, the front side of the second solar cell may face upward. Additionally or alternatively, during the assembling of a solar cell arrangement comprising a plurality of overlapping solar cell pieces, as described herein, the front sides of the respective solar cell pieces may face upward. In particular, the front side of the first solar cell piece and the front side of the second solar cell face piece may face upward.

The second solar cell piece as described herein, e.g. a solar cell piece 10b, may be an outermost solar cell piece of a solar cell arrangement.

A solar cell arrangement comprising a plurality of overlapping solar cell pieces, as described herein, may be a linear arrangement, e.g. a string, of overlapping solar cell pieces. A solar cell arrangement may be a shingled solar cell arrangement. A solar cell arrangement may include two outermost solar cell pieces. The solar cell arrangement may include one or more inner solar cell pieces. An inner solar cell piece may be arranged between the two outermost solar cell pieces.

An outermost solar cell piece of a solar cell arrangement may be a last solar cell piece of the solar cell arrangement, e.g. solar cell piece 10b as shown in FIG. 5. The second solar cell piece may be a last solar cell piece of the solar cell arrangement. A solar cell arrangement may have a single last solar cell piece. The back side of the last solar cell piece of a solar cell arrangement may be connected to the front side of an adjacent solar cell piece of the solar cell arrangement, e.g. by an adhesive as described herein. The adhesive may be printed on the front side of the adjacent solar cell piece, e.g. by an adhesive application unit arranged on the first processing line. The front side of the last solar cell piece may not be connected to any further solar cell piece of the solar cell arrangement. The front side of the last solar cell piece may not include an adhesive as described herein. The front side of the last solar cell piece may include a bus bar. The bus bar on the front side of the last solar cell piece may be wider than a bus bar provided on the front side of an inner solar cell piece of the solar cell arrangement. The bus bar on the front side of the last solar cell piece may be wider than a bus bar provided on the front side of a leading solar cell piece of the solar cell arrangement, as described herein. The bus bar on the front side of the last solar cell piece may be wider than every bus bar provided on the respective front sides of the other solar cell pieces of the solar cell arrangement.

An outermost solar cell piece of a solar cell arrangement, as described herein, may be a leading solar cell piece of the solar cell arrangement, e.g. solar cell piece 10b shown in FIG. 8. The second solar cell piece may be a leading solar cell piece of the solar cell arrangement. A solar cell arrangement may have a single leading solar cell piece. The front side of a leading solar cell piece may be connected to the back side of an adjacent solar cell piece of the solar cell arrangement, e.g. by an adhesive as described herein. The adhesive may be a pre-formed adhesive. The pre-formed adhesive may be applied to the leading solar cell piece by an adhesive application unit, e.g. a pre-formed adhesive dispenser, arranged on the second processing line, as described herein. The back side of the leading solar cell piece may not be connected to any further solar cell piece of the solar cell arrangement. The front side of the leading solar cell piece may include a bus bar. The bus bar on the front side of the leading solar cell piece may have the same width as a bus bar provided on the front side of an adjacent solar cell piece of the solar cell arrangement.

A first solar cell piece, as described herein, may include a first bus bar on the front side of the first solar cell piece. The first bus bar may have a first width. The second solar cell piece may include a second bus bar on the front side of the second solar cell piece. The second bus bar may have a second width. The second width may be larger than the first width. For example, the second width may be from 300 μm to 1500 μm, more particularly from 400 μm to 800 μm. The first width may be from 100 μm to 1000 μm, more particularly from 200 μm to 500 μm.

The first bus bar may be the only bus bar on the front side of the first solar cell piece. The second bus bar may be the only bus bar on the front side of the second solar cell piece.

The first solar cell piece may include an adhesive as described herein. The adhesive may be provided on the front side of the first solar cell piece. The adhesive may be provided on the first bus bar. The first solar cell piece may include a backside bus bar on the back side of the first solar cell piece.

The method may include connecting the second solar cell piece to the first solar cell piece by an adhesive as described herein, particularly an adhesive on the front side of the first solar cell piece.

According to a further embodiment, a solar cell arrangement comprising a plurality of overlapping solar cell pieces is provided. The plurality of overlapping solar cell pieces include a first solar cell piece, as described herein, and a second solar cell piece, as described herein. The first solar cell piece includes a first bus bar, as described herein, on a front side of the first solar cell piece. The first bus bar has a first width, as described herein. The second solar cell piece includes a second bus bar, as described herein, on a front side of the second solar cell piece. The second bus bar has a second width as described herein. The second width is larger than the first width. The solar cell arrangement may be manufactured by the method and/or apparatus a described herein.

While the foregoing is directed to embodiments of the disclosure, other and further embodiments of the disclosure may be devised without departing from the basic scope thereof, and the scope thereof is determined by the claims that follow.

The invention claimed is:

1. An apparatus, comprising:
   a scribing station for scribing a solar cell to provide the solar cell with at least one scribed portion;
   a cleaving station adapted for breaking the solar cell into two or more solar cell shingles at at least one breaking location defined by the at least one scribed portion of the solar cell;
   an assembling station adapted for assembling a shingled solar cell arrangement comprising a plurality string of partially overlapping solar cell shingles, wherein adjacent solar cell shingles of the shingled solar cell arrangement are electrically connected to each other in an overlapping region via an electrically conductive adhesive;
   a first transportation system adapted for transporting solar cell shingles from the cleaving station to the assembling station;
   a storing station adapted for storing a plurality of solar cell shingles, wherein each solar cell shingle of the stored plurality of solar cell shingles does not include an electrically conductive adhesive for connecting the solar cell shingle to a further solar cell shingle; and
   a second transportation system adapted for transporting solar cell shingles from the storing station to the first transportation system.

2. The apparatus of claim 1, wherein the second transportation system is a two-way transportation system adapted for transporting solar cell shingles from the storing station to the first transportation system and from the first transportation system to the storing station.

3. A method for manufacturing a shingled solar cell arrangement, comprising:
scribing a solar cell to provide the solar cell with at least one scribed portion;
separating a solar cell into two or more solar cell shingles by breaking the solar cell at at least one breaking location defined by the at least one scribed portion of the solar cell, the two or more solar cell shingles including a first solar cell shingle;
transporting the first solar cell shingle to an assembling station;
storing a second solar cell shingle in a storing station, wherein, during the storing, the second solar cell shingle does not include an electrically conductive adhesive for connecting the second solar cell shingle to a further solar cell shingle;
transporting the second solar cell shingle from the storing station to the assembling station; and
assembling a shingled solar cell arrangement comprising a string of partially overlapping solar cell shingles, wherein adjacent solar cell shingles of the shingled solar cell arrangement are electrically connected to each other in an overlapping region via an electrically conductive adhesive, the shingled solar cell arrangement including the first solar cell shingle and the second solar cell shingle.

4. The method of claim 3, wherein the second solar cell shingle is an outermost solar cell shingle of the shingled solar cell arrangement.

5. The method of claim 3, further comprising:
providing the second solar cell shingle by separating a further solar cell into two or more further solar cell shingles, the two or more further solar cell shingles including the second solar cell shingle; and
transporting the second solar cell shingle to the storing station.

6. The method of claim 5, wherein:
during the separating the solar cell into the two or more solar cell shingles, a front side of the solar cell faces upward; or
during the transporting the first solar cell shingle, a front side of the first solar cell shingle faces upward; or
during the storing the second solar cell shingle, a front side of the second solar cell shingle faces upward; or
during the transporting the second solar cell shingle, a front side of the second solar cell faces upward; or
during the assembling, the front side of the first solar cell shingle and the front side of the second solar cell shingle face upward; or
any combination thereof.

7. The method of claim 6, wherein the first solar cell shingle comprises a first bus bar on a front side of the first solar cell shingle, the first bus bar having a first width; and
the second solar cell shingle comprises a second bus bar on a front side of the second solar cell shingle, the second bus bar having a second width, wherein the second width is larger than the first width.

8. The apparatus of claim 1, wherein the first transportation system and the second transportation system each comprise one or more conveyors.

9. The apparatus of claim 1, wherein the storing station is adapted for storing the plurality of solar cell shingles stacked on top of each other.

10. The apparatus of claim 1, wherein the apparatus includes a first processing line including the cleaving station, the first transportation system and the assembling station and a second processing line including the storing station and the second transportation system.

11. The apparatus of claim 10, wherein the second processing line further comprises an adhesive application station.

12. The apparatus of claim 11, wherein the adhesive application station is an adhesive dispensing station.

13. The apparatus of claim 10, wherein the first processing line further comprises:
a scribing station including a scribing unit for scribing solar cells or solar cell shingles; or
a flipping station including a flipping unit configured for turning over a solar cell; or
an adhesive application station including an adhesive printing unit; or
a curing station including a curing unit configured for curing a solar cell arrangement of overlapping solar cell shingles; or
any combination thereof.

14. The apparatus of claim 10, further comprising a control unit for controlling a supply of solar cell shingles from the storing station to the first processing line.

15. The method of claim 5, wherein transporting the second solar cell shingle to the storing station includes transporting the second solar cell shingle by a two-way transportation system.

16. The method of claim 3, wherein a plurality of solar cell shingles stacked on top of each other are stored in the storing station.

17. The method of claim 3, the method further comprising controlling a supply of solar cell shingles from the storing station to the assembling station.

* * * * *